United States Patent
Whittaker et al.

(10) Patent No.: US 12,392,823 B2
(45) Date of Patent: Aug. 19, 2025

(54) SYSTEMS AND METHODS FOR ON-CHIP NOISE MEASUREMENTS

(71) Applicant: D-WAVE SYSTEMS INC., Burnaby (CA)

(72) Inventors: Jed D. Whittaker, Vancouver (CA); Richard Harris, North Vancouver (CA); Rahul Deshpande, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 206 days.

(21) Appl. No.: 17/970,853

(22) Filed: Oct. 21, 2022

(65) Prior Publication Data

US 2023/0400510 A1    Dec. 14, 2023

Related U.S. Application Data

(60) Provisional application No. 63/276,113, filed on Nov. 5, 2021.

(51) Int. Cl.
    *G01R 31/317* (2006.01)
(52) U.S. Cl.
    CPC . *G01R 31/31702* (2013.01); *G01R 31/31709* (2013.01)
(58) Field of Classification Search
    None
    See application file for complete search history.

(56) References Cited

U.S. PATENT DOCUMENTS

| | | | |
|---|---|---|---|
| 4,009,479 | A | 2/1977 | Cardinne et al. |
| 4,028,714 | A | 6/1977 | Henkels |
| 4,454,522 | A | 6/1984 | De |
| 4,490,733 | A | 12/1984 | Kroger |
| 4,554,567 | A | 11/1985 | Jillie et al. |

(Continued)

FOREIGN PATENT DOCUMENTS

| | | |
|---|---|---|
| CN | 1471180 A | 1/2004 |
| CN | 101088102 A | 12/2007 |

(Continued)

OTHER PUBLICATIONS

Chinese Office Action dated Mar. 30, 2023, for Chinese Application No. 201880021010X, 12 pages (English translation of action).

(Continued)

*Primary Examiner* — Jermele M Hollington
(74) *Attorney, Agent, or Firm* — Cozen O'Connor

(57) ABSTRACT

Systems and methods for measuring noise in discrete regions of multi-layer superconducting fabrication stacks are described. Methods for measuring noise in spatial regions of a superconducting fabrication stacks may include the use of resonators, each having a different geometry. As many resonators as spatial regions are fabricated. Data collected from the resonators may be used to calculate fill fractions and spin densities for different spatial regions of the superconducting fabrication stack. The data may be collected via on-chip electron-spin resonance. The superconducting fabrications may be part of a fabrication stack for a superconducting processor, for example a quantum processor, and the spatial region studied may be proximate to qubit wiring layers.

18 Claims, 4 Drawing Sheets

(56) References Cited

U.S. PATENT DOCUMENTS

| | | |
|---|---|---|
| 4,689,559 A | 8/1987 | Hastings et al. |
| 4,749,888 A | 6/1988 | Sakai et al. |
| 4,912,975 A | 4/1990 | Ohta et al. |
| 5,055,158 A | 10/1991 | Gallagher et al. |
| 5,084,438 A | 1/1992 | Matsubara et al. |
| 5,087,605 A | 2/1992 | Hegde et al. |
| 5,131,976 A | 7/1992 | Hoko |
| 5,157,466 A | 10/1992 | Char et al. |
| 5,250,817 A | 10/1993 | Fink |
| 5,274,249 A | 12/1993 | Xi et al. |
| 5,290,761 A | 3/1994 | Keating et al. |
| 5,307,068 A | 4/1994 | Hartemann |
| 5,323,344 A | 6/1994 | Katayama et al. |
| 5,323,520 A | 6/1994 | Peters et al. |
| 5,339,457 A | 8/1994 | Kawasaki et al. |
| 5,358,928 A | 10/1994 | Ginley et al. |
| 5,514,974 A | 5/1996 | Bouldin |
| 5,548,130 A | 8/1996 | Shimizu et al. |
| 5,627,139 A | 5/1997 | Chin et al. |
| 5,672,212 A | 9/1997 | Manos |
| 5,767,043 A | 6/1998 | Cantor et al. |
| 5,776,863 A | 7/1998 | Silver |
| 5,804,251 A | 9/1998 | Yu et al. |
| 5,846,846 A | 12/1998 | Suh et al. |
| 5,858,106 A | 1/1999 | Ohmi et al. |
| 5,863,868 A | 1/1999 | Chan et al. |
| 5,869,846 A | 2/1999 | Higashino et al. |
| 5,880,069 A | 3/1999 | Nakao et al. |
| 5,892,243 A | 4/1999 | Chan |
| 5,962,865 A | 10/1999 | Kerber et al. |
| 5,962,866 A | 10/1999 | Diiorio et al. |
| 6,011,981 A | 1/2000 | Alvarez et al. |
| 6,133,635 A | 10/2000 | Bothra et al. |
| 6,165,801 A | 12/2000 | Burns et al. |
| 6,188,919 B1 | 2/2001 | Lagraff et al. |
| 6,242,387 B1 | 6/2001 | Cukauskas et al. |
| 6,284,721 B1 | 9/2001 | Lee |
| 6,362,638 B1 | 3/2002 | Ashton et al. |
| 6,384,423 B1 | 5/2002 | Kerber et al. |
| 6,384,424 B1 | 5/2002 | Kugai et al. |
| 6,420,189 B1 | 7/2002 | Lopatin |
| 6,459,097 B1 | 10/2002 | Zagoskin |
| 6,476,413 B1 | 11/2002 | Jia et al. |
| 6,495,854 B1 | 12/2002 | Newns et al. |
| 6,517,944 B1 | 2/2003 | Puzey et al. |
| 6,541,789 B1 | 4/2003 | Sato et al. |
| 6,563,311 B2 | 5/2003 | Zagoskin |
| 6,569,252 B1 | 5/2003 | Sachdev et al. |
| 6,624,122 B1 | 9/2003 | Holesinger et al. |
| 6,627,915 B1 | 9/2003 | Ustinov et al. |
| 6,715,944 B2 | 4/2004 | Oya et al. |
| 6,753,546 B2 | 6/2004 | Tzalenchuk et al. |
| 6,767,840 B1 | 7/2004 | Uehara et al. |
| 6,803,599 B2 | 10/2004 | Amin et al. |
| 6,849,557 B1 | 2/2005 | Ko |
| 6,882,293 B2 | 4/2005 | Shoji et al. |
| 6,905,887 B2 | 6/2005 | Amin et al. |
| 6,936,808 B2 | 8/2005 | Uchida |
| 6,979,836 B2 | 12/2005 | Zagoskin et al. |
| 7,091,132 B2 | 8/2006 | Tan et al. |
| 7,135,701 B2 | 11/2006 | Amin et al. |
| 7,418,283 B2 | 8/2008 | Amin |
| 7,533,068 B2 | 5/2009 | Maassen et al. |
| 7,619,437 B2 | 11/2009 | Thom et al. |
| 7,624,088 B2 | 11/2009 | Johnson et al. |
| 7,638,434 B2 | 12/2009 | Helneder |
| 7,639,035 B2 | 12/2009 | Berkley |
| 7,675,139 B2 | 3/2010 | Nomura et al. |
| 7,843,209 B2 | 11/2010 | Berkley |
| 7,876,248 B2 | 1/2011 | Berkley et al. |
| 7,898,282 B2 | 3/2011 | Harris et al. |
| 7,981,759 B2 | 7/2011 | Cervin-Lawry et al. |
| 8,008,942 B2 | 8/2011 | Van et al. |
| 8,018,244 B2 | 9/2011 | Berkley |
| 8,035,540 B2 | 10/2011 | Berkley et al. |
| 8,098,179 B2 | 1/2012 | Bunyk et al. |
| 8,169,231 B2 | 5/2012 | Berkley |
| 8,173,228 B2 | 5/2012 | Choi et al. |
| 8,190,548 B2 | 5/2012 | Choi |
| 8,195,596 B2 | 6/2012 | Rose et al. |
| 8,283,943 B2 | 10/2012 | Van Den Brink et al. |
| 8,301,214 B1 | 10/2012 | Tolpygo et al. |
| 8,421,053 B2 | 4/2013 | Bunyk et al. |
| 8,437,818 B1 | 5/2013 | Tolpygo et al. |
| 8,536,566 B2 | 9/2013 | Johansson et al. |
| 8,571,614 B1 | 10/2013 | Mukhanov et al. |
| 8,611,974 B2 | 12/2013 | Maibaum et al. |
| 8,644,898 B1 | 2/2014 | De Andrade et al. |
| 8,742,594 B2 | 6/2014 | Daubenspeck et al. |
| 8,854,074 B2 | 10/2014 | Berkley |
| 8,933,695 B1 | 1/2015 | Kornev et al. |
| 8,951,808 B2 | 2/2015 | Ladizinsky et al. |
| 9,130,116 B1 | 9/2015 | Tolpygo et al. |
| 9,136,457 B2 | 9/2015 | Tolpygo |
| 9,183,508 B2 | 11/2015 | King |
| 9,324,767 B1 | 4/2016 | Steinbach et al. |
| 9,355,362 B2 | 5/2016 | Shea et al. |
| 9,490,296 B2 | 11/2016 | Ladizinsky et al. |
| 9,495,644 B2 | 11/2016 | Chudak et al. |
| 9,520,180 B1 | 12/2016 | Mukhanov et al. |
| 9,564,573 B1 | 2/2017 | Chang et al. |
| 9,634,224 B2 | 4/2017 | Ladizinsky et al. |
| 9,768,371 B2 | 9/2017 | Ladizinsky et al. |
| 9,971,970 B1 | 5/2018 | Rigetti et al. |
| 9,978,809 B2 | 5/2018 | Ladizinsky et al. |
| 10,141,493 B2 | 11/2018 | Tuckerman |
| 10,290,425 B2 | 5/2019 | Shindo et al. |
| 10,454,015 B2 | 10/2019 | Lanting et al. |
| 10,528,886 B2 | 1/2020 | Boothby |
| 10,938,346 B2 | 3/2021 | Berkley et al. |
| 11,038,095 B2 | 6/2021 | Huang et al. |
| 11,100,416 B2 | 8/2021 | Lanting et al. |
| 11,105,866 B2 | 8/2021 | Swenson et al. |
| 11,127,893 B2 | 9/2021 | Johnson et al. |
| 11,295,225 B2 | 4/2022 | Hoskinson et al. |
| 11,930,721 B2 * | 3/2024 | Ladizinsky .......... H10N 60/805 |
| 12,034,404 B2 | 7/2024 | Berkley et al. |
| 2001/0004479 A1 | 6/2001 | Cheung et al. |
| 2001/0020701 A1 | 9/2001 | Zagoskin |
| 2002/0017906 A1 | 2/2002 | Ho et al. |
| 2002/0117738 A1 | 8/2002 | Amin et al. |
| 2002/0180006 A1 | 12/2002 | Franz et al. |
| 2002/0188578 A1 | 12/2002 | Amin et al. |
| 2002/0190343 A1 | 12/2002 | Jones et al. |
| 2002/0190381 A1 | 12/2002 | Herr et al. |
| 2003/0027724 A1 | 2/2003 | Rose et al. |
| 2003/0068832 A1 | 4/2003 | Koval et al. |
| 2003/0089987 A1 | 5/2003 | Parikh |
| 2003/0102470 A1 | 6/2003 | Il et al. |
| 2003/0107033 A1 | 6/2003 | Tzalenchuk et al. |
| 2003/0203639 A1 | 10/2003 | Ko et al. |
| 2004/0077504 A1 | 4/2004 | Adachi et al. |
| 2004/0087081 A1 | 5/2004 | Aitchison et al. |
| 2004/0155237 A1 | 8/2004 | Kerber |
| 2004/0191697 A1 | 9/2004 | Nakatsuka et al. |
| 2004/0266209 A1 | 12/2004 | Hinode et al. |
| 2005/0029512 A1 | 2/2005 | Hato et al. |
| 2005/0062131 A1 | 3/2005 | Murduck et al. |
| 2005/0087893 A1 | 4/2005 | Chung et al. |
| 2005/0107261 A1 | 5/2005 | Cantor et al. |
| 2005/0251990 A1 | 11/2005 | Choi et al. |
| 2006/0197193 A1 | 9/2006 | Gu et al. |
| 2007/0077765 A1 | 4/2007 | Prince et al. |
| 2007/0123040 A1 | 5/2007 | Hwang et al. |
| 2008/0001699 A1 | 1/2008 | Gardner et al. |
| 2008/0070325 A1 | 3/2008 | Tolpygo |
| 2009/0033353 A1 | 2/2009 | Yu et al. |
| 2009/0078931 A1 | 3/2009 | Berkley |
| 2009/0203192 A1 | 8/2009 | Kaltalioglu et al. |
| 2009/0319757 A1 | 12/2009 | Berkley |
| 2011/0022820 A1 | 1/2011 | Bunyk et al. |
| 2011/0065586 A1 | 3/2011 | Maibaum et al. |
| 2011/0089405 A1 | 4/2011 | Ladizinsky et al. |
| 2011/0095435 A1 | 4/2011 | Volant et al. |

(56) References Cited

U.S. PATENT DOCUMENTS

| | | |
|---|---|---|
| 2012/0319211 A1 | 12/2012 | Van Dal et al. |
| 2013/0116159 A1 | 5/2013 | Pollard et al. |
| 2014/0111242 A1 | 4/2014 | Xie et al. |
| 2015/0032994 A1 | 1/2015 | Chudak et al. |
| 2015/0046681 A1 | 2/2015 | King |
| 2015/0119252 A1 | 4/2015 | Ladizinsky et al. |
| 2015/0119253 A1 | 4/2015 | Yohannes et al. |
| 2015/0219730 A1 | 8/2015 | Tsukamoto et al. |
| 2015/0236235 A1 | 8/2015 | Ladizinsky et al. |
| 2016/0079968 A1 | 3/2016 | Strand et al. |
| 2016/0170675 A1 | 6/2016 | Pickerell et al. |
| 2018/0053689 A1 | 2/2018 | Kirby et al. |
| 2018/0145631 A1 | 5/2018 | Berkley et al. |
| 2018/0219150 A1 | 8/2018 | Lanting et al. |
| 2018/0308896 A1 | 10/2018 | Ladizinsky et al. |
| 2018/0337138 A1 | 11/2018 | Luu et al. |
| 2019/0019099 A1 | 1/2019 | Hoskinson et al. |
| 2019/0044044 A1 | 2/2019 | Lampert et al. |
| 2019/0044048 A1 | 2/2019 | George et al. |
| 2019/0044051 A1 | 2/2019 | Caudillo et al. |
| 2019/0164959 A1 | 5/2019 | Thomas et al. |
| 2019/0288176 A1 | 9/2019 | Yoscovits et al. |
| 2019/0332965 A1 | 10/2019 | Barends |
| 2019/0369171 A1 | 12/2019 | Swenson et al. |
| 2020/0012961 A1 | 1/2020 | Kelly et al. |
| 2020/0144476 A1 | 5/2020 | Huang et al. |
| 2020/0152851 A1 | 5/2020 | Lanting et al. |
| 2020/0266234 A1 | 8/2020 | Boothby et al. |
| 2021/0190885 A1 | 6/2021 | Swenson et al. |
| 2021/0375516 A1 | 12/2021 | Sterling et al. |
| 2022/0123048 A1 | 4/2022 | Swenson et al. |
| 2022/0328747 A1* | 10/2022 | Griggio ............... H10N 60/805 |
| 2023/0004851 A1 | 1/2023 | Harris et al. |
| 2023/0400510 A1 | 12/2023 | Whittaker et al. |

FOREIGN PATENT DOCUMENTS

| | | |
|---|---|---|
| CN | 102334206 A | 1/2012 |
| CN | 105914219 A | 8/2016 |
| EP | 0329603 A2 | 8/1989 |
| EP | 0437971 A1 | 7/1991 |
| EP | 0466611 A1 | 1/1992 |
| EP | 0476844 A1 | 3/1992 |
| EP | 0477495 A1 | 4/1992 |
| EP | 0732756 A2 | 9/1996 |
| EP | 0756335 A1 | 1/1997 |
| EP | 2401776 B1 | 8/2016 |
| JP | S60140885 A | 7/1985 |
| JP | S6215869 A | 1/1987 |
| JP | S6257263 A | 3/1987 |
| JP | S62200777 A | 9/1987 |
| JP | 63007675 A | 1/1988 |
| JP | S637675 A | 1/1988 |
| JP | S63226981 A | 9/1988 |
| JP | S6411357 U | 1/1989 |
| JP | S6476610 A | 3/1989 |
| JP | H027583 A | 1/1990 |
| JP | H03286578 A | 12/1991 |
| JP | H04246871 A | 9/1992 |
| JP | H04334074 A | 11/1992 |
| JP | H05102547 A | 4/1993 |
| JP | H05114756 A | 5/1993 |
| JP | H06260692 A | 9/1994 |
| JP | H07066462 A | 3/1995 |
| JP | H07245404 A | 9/1995 |
| JP | H08236823 A | 9/1996 |
| JP | H104223 A | 1/1998 |
| JP | 2001516970 A | 10/2001 |
| JP | 2001516970 T | 10/2001 |
| JP | 2003092436 A | 3/2003 |
| JP | 2004-079882 | 3/2004 |
| JP | 2004079882 A | 3/2004 |
| JP | 2004128437 A | 4/2004 |
| JP | 2004519102 A | 6/2004 |
| JP | 2005-39244 A | 2/2005 |
| JP | 2005039244 A | 2/2005 |
| JP | 2007150257 A | 6/2007 |
| JP | 2009111306 A | 5/2009 |
| JP | 2012519379 A | 8/2012 |
| JP | 6059754 B2 | 12/2016 |
| KR | 20000026669 A | 5/2000 |
| KR | 20010067425 A | 7/2001 |
| KR | 20190035900 A | 4/2019 |
| WO | 99/14800 A1 | 3/1999 |
| WO | 0201327 A2 | 1/2002 |
| WO | 02069411 A2 | 9/2002 |
| WO | 2005093649 A1 | 10/2005 |
| WO | 2007085074 A1 | 8/2007 |
| WO | 2008138150 A1 | 11/2008 |
| WO | 2009120638 A2 | 10/2009 |
| WO | 2009149086 A2 | 12/2009 |
| WO | 2013180780 A2 | 12/2013 |
| WO | 2016025598 A1 | 2/2016 |
| WO | 2016183213 A1 | 11/2016 |
| WO | 2017192733 A2 | 11/2017 |
| WO | 2018144601 A1 | 8/2018 |
| WO | 2019055002 A1 | 3/2019 |
| WO | 2019179732 A1 | 9/2019 |
| WO | 2020212437 A1 | 10/2020 |
| WO | 2021231224 A1 | 11/2021 |
| WO | 2021262741 A1 | 12/2021 |
| WO | 2022178130 A1 | 8/2022 |
| WO | 2024102504 A2 | 5/2024 |

OTHER PUBLICATIONS

Niepce, "Fabrication and Characterisation of Thin-Film Superconducting Nanowire Superconductors for Novel Quantum Devices", Master's Thesis in Nanoscience, Chalmers University of Technology, ISSN 1652-8557, 2014, 66 pages.

Blanquart et al., et al., "Evaluation and Comparison of Novel Precursors for Atomic Layer Deposition of Nb2O5 Thin Films", Chem. Mater., Feb. 8, 2012, 6 pages.

Born, et al., "Fabrication of Ultrasmall Tunnel Junctions by Electron Beam Direct-Writing", IEEE, 2001, 4 pages.

Buchholz, et al., "LTS junction technology for RSFQ and qubit circuit applications", Science Direct, Jul. 24, 2006, 8 pages.

Campbell, et al., "Dynamics of Oxidation of Aluminum Nanoclusters using Variable Charge Molecular-Dynamics Simulations on Parallel Computers", APS Physics, Jun. 14, 1999, 4 pages.

Chan, et al., "Interface between gold and superconducting YBa2Cu3O7-x", J. Mater. Res, 1995, 6 pages.

Cucolo, et al., "Linear normal conductance in copper oxide tunnel junctions", Phys. Rev. B 54, 1996, 3 pages.

Dagan, et al., "C-axis tunneling on YBCO films", Eur. Phys. J. B 19, 2001, 5 pages.

Dimos, et al., "Orientation Dependence of Grain-Boundary Critical Currents in YBa2Cu3O7 Biocrystals", Physical Review Letters, Jul. 11, 1988, 5 pages.

Dolata, et al., "Platinum thin film resistors with Cr under- and overlayers for Nb/Al2O3/Nb technology", Science Direct, Jul. 19, 2005, 4 pages.

Faucher, et al., "Niobium and niobium nitride SQUIDs based on anodized nanobridges made with an atomic force microscope", Science Direct, Mar. 1, 2002, 7 pages.

Geerlings, et al., "Improving the Quality Factor of Microwave Compact Resonators by Optimizing their Geometrical Parameters", Applied Physics Letters, 2012, 4 pages.

Grabert, et al., "Mesoscopic Josephson effect", Superlattices and Microstructures 25, 2019, 10 pages,.

Grünhaupt, et al., "Granular aluminum: A superconducting material for high impedance quantum circuits", arXiv, Sep. 27, 2018, 9 pages.

Grünhaupt, et al., "Quasiparticle dynamics in granular aluminum close to the superconductor to insulator transition", arXiv, Feb. 7, 2018.

Hadfield, et al., "Novel Josephson junction geometries in NbCu bilayers fabricated by focused ion beam microscope", Physica C, North-Holland Publishing, Amsterdam, Feb. 15, 2002, 9 pages.

(56) References Cited

OTHER PUBLICATIONS

Harris, "Improved coherence leads to gains in quantum annealing performance", D-Wave, 2019, 4 pages.
Havemann, et al., "High-performance interconnects: an integration overview", IEEE, May 2001, 16 pages.
Herr, et al., "Reproducible Operating Margins on a 72,800-Device Digital Superconducting Chip", arXiv, Oct. 5, 2015, 6 pages.
Hilgenkamp, et al., "Implications of $dx2-y2$ symmetry and faceting for the transport properties of grain boundaries in high-TC superconductors", Physical Review B 53, 1996, 8 pages.
Hinode, et al., "Fabrication of reliable via conductors for niobium SFQ devices", Science Direct, Jul. 19, 2005, 8 pages.
Hypres, "Niobium Integrated Circuit Fabrication Process #S45/100/200 Design Rules", Hypres, Mar. 10, 2015, 9 pages.
Iguchi, et al., "Experimental evidence for a d-wave pairing state in $YBa2Cu3O7-y$ from a study of $YBa2Cu3O7-y$/ insulator/Pb Josephson tunnel junctions", Phys. Rev. B 49, 1994, 4 pages.
Il'Ichev, et al., "Nonsinusoidal Current-Phase Relationship of Grain Boundary Josephson junctions in High-To Superconductors", Physical Review Letters 81, 1998, 4 pages.
Joyez, et al., "Observation of Parity-Induced Suppression of Josephson Tunneling in the Superconducting Single Electron Transistor", Phys. Rev., Lett. 72, Jul. 19, 2005, 5 pages.
Koelle, et al., "High-transition-temperature superconducting quantum interference devices", Reviews of Modern Physics 71, 199, 56 pages.
Kohl, "Low-Dielectric Constant Insulators for Future Integrated Circuits and Packages", Georgia Tech, Mar. 14, 2011, 25 pages.
Kouznetsov, et al., "c-axis Josephson Tunneling between $YBa2Cu3O7-\delta$ and Pb: Direct Evidence for Mixed Order Parameter Symmetry in a High-Tc Superconductor", Phys. Rev. Lett. 79, 1997, 4 pages.
Kubatkin, et al., "Coulomb blockade electrometer with a high-Tcisland", JETP Letters 63, 1996, 7 pages.
LEVINSEN, "Electromagnetic properties of the Dayem bridge", HAL Archives, Jan. 1, 1974, 11 pages.
Maleeva, et al., "Circuit Quantum Electrodynamics of Granular Aluminum Resonators", arXiv, Feb. 7, 2018, 17 pages.
Martinis, et al., "Critical Field for Complete Vortex Expulsion from Narrow Superconducting Strips", UCSB, Mar. 5, 2004, 4 pages.
Matveev, et al., "Parity-Induced Suppression of the Coulomb Blockade of Josephson Tunneling", Phys. Rev. Lett. 70, 1993, 4 pages.
Mckenney, et al., "Design considerations for a background limited 350 micron pixel array using lumped element superconducting microresonators", SPIE, Sep. 24, 2012, 10 pages,.
Nagasawa, et al., "Development of advanced Nb process for SFQ circuits", Science Direct, Jun. 9, 2004, 8 pages.
Potts, et al., "CMOS compatible fabrication methods for submicron Josephson junction qubits" IEEE, Sep. 5, 2001, 4 pages.
Russo, et al., "Characterization of Superconducting Thin Films and nanoSQUIDs for Nanoparticle Investigation at High Magnetic Field", IEEE, Feb. 18, 2012, 4 pages.
Satoh, et al., "Fabrication process of planarized multi-layer Nb Integrated circuits", IEEE, Jun. 13, 2005, 4 pages.
Satoh, et al., "Planarization of Josephson junctions for large-scale integrated Nb SFQ circuits by mechanical polishing", Science Direct, 1999, 4 pages.
Tafuri, et al., "Feasibility of Blepitaxial YbaCuO Josephson Junctions for Fundamental Studies and Potential Circuit Implementation", Los Alamos National Laboratory preprint server condmat, Dec. 18, 2002, 21 pages.
Tolpygo, et al., "Deep Sub-Micron Stud-Via Technology for Superconductor VLSI Circuits", IOP Science, Jan. 14, 2014, 10 pages.
Tsuei, et al., "Pairing symmetry in cuprate superconductors", Reviews of Modern Physics 72, 2000, 48 pages.
Valenti, et al., "Interplay between kinetic inductance, non-linearity and quasiparticle dynamics in granular aluminum MKIDs", arXiv, Nov. 10, 2018, 14 pages.

Van Harlingen, "Phase-sensitive tests of the symmetry of the pairing state in the high-temperature superconductors-Evidence for $dx2-y2$ symmetry", Rev. Mod. Phys. 67, 1995, 23 pages.
Vinante, et al., "Hot-electron effect in palladium thin films", APS Physics, Mar. 13, 2007, 5 pages.
Wen, et al., "Microstructure of ramp-edge $Yba2Cu3O3$/$PrBa2Cu3O2$ Josephson junctions on different substrates", Physica C 255, 1995, 13 pages.
Wollman, et al., "Evidence for $dx2-y2$ Pairing from the Magnetic Field Modulation of $YBa2Cu3O7$-Pb Josephson Junctions". Phys. Rev. Lett 74, Jan. 30, 1995, 4 pages.
Yohannan, "Characterization of alpha and beta phases of tantalum coatings", New Jersey Institute of Technology, Aug. 31, 2001, 107 pages,.
Zantye, Parshuram B, et al., "Chemical mechanical planarization for microelectronics application", Materials Science and Engineering R 45 (2004) 89-220. 2004 (Year: 2004), 132 pages.
Non Final Office Action for U.S. Appl. No. 17/681,303, filed May 17, 2023, 13 pages.
Bronn, et al., "High Coherence Plane Breaking Packaging for Superconducting Qubits", arXiv:1709.02402v2 [quant-ph] Feb. 14, 2018, 101 pages.
Chapter: Appendix C: Superconducting Quantum Computers, Quantum, Computing Progress and Prospects, the National Academies Press, 2019, 10 pages.
Chen et al., "Qubit architecture with high coherences and fast tunable coupling", Physical Review Letters, Feb. 28, 2014. https://arxiv.org/abs/1402.7367.
DeGraaf, et al., "Suppression of low-frequency charge noise in superconducting resonators by surface spin desorption", Supplementary Information, 8 pages.
Elsherbini, et al., "Flip Chip Packaging for Superconducting Quantum Computers", APS—APS March Meeting 2018—Event—vol. 63, No. 1, 1 page.
Fourie, et al., "Wk2EOr3B-05—Experimental verification of moat design and flux trapping analysis", Stellenbosch University, ASC 2020, Virtual Conference, Nov. 4, 2020.
Foxen, et al., Qubit compatible superconducting interconnects, arXiv:1708.04270v2 [quant-ph], Sep. 29, 2017, 19 pages.
Fritz, et al., "Optimization of Al/AlOx/Al-layer systems for Josephson Junctions from a microstructure point of view", Journal of Applied Physics, 125, 165301 (2019). 11 pages.
Gargiulo, et al., "Fast flux control of 3D transmon qubits using a magnetic hose", : Appl. Phys. Lett. 118, 012601 (2021); https://doi.org/10.1063/5.0032615, 7 pages.
Hilton, et al., "Fabrication of prototype imaging arrays for SCUBA-2 ", Preprint submitted to Elsevier Science, Oct. 3, 2005.
Hsu_"CES 2018 Inte'ls 49-Qubit Chip Shoots for Quantum Supremacy", IEEE Spectrum, 4 pages.
Kamal., et al., "Improved superconducting qubit coherence with high-temperature substrate annealing", arXiv:1606.09262v1 [cond-mat.mes-hall] Jun. 29, 2016, 10 pages.
Koch, et al., "Charge-insensitive qubit design derived from the Cooper pair box", Physical Review A 76, 042319 (2007), 19 pages.
Lei, et al., "High coherence superconducting microwave cavities with indium bump bonding", Appl. Phys. Lett. 116, 154002 (2020), 6 pages.
Narayana, et al., " Design and testing of high-speed interconnects for Superconducting multi-chip modules", MIT Lincoln Laboratory, 244 Wood Street, 2012, 16 pages.
Nguyen et al., "The high-coherence fluxonium qubit", arXiv:1810.11006v1, Oct. 25, 2018.
Rich, "DC Squid Magnetometry", Christopher Bennett Rich 2019 Thesis, Simon Fraser University Fall 2019, 58 pages.
Rosenberg, et al., "3D integrated superconducting qubits", arXiv:1706.04116v2 [quant-ph] Jun. 19, 2017, 6 pages.
Sharma, "Fabrication and Characterization of AL/ALOx/AL Josephson Junctions", Mater of Science, Texas A&M University, Dec. 2015, 84 pages.
Shen, et al., "Character and fabrication of Al/al2o3/al tunnel junctions for qubit application", Chinese Science Bulletin, Feb. 2012 Vo. 57 No. 4: 409-412.

(56) References Cited

OTHER PUBLICATIONS

Steffen, et al., "Recent research trends for high coherence quantum circuits", IOP Publishing, Supercond. Sci. Technol, 30 (2017), 5 pages.

Tennant, et al., "Low frequency correlated charge noise measurements across multiple energy transitions in a tantalum transmon", arXiv:2106.08406v1 [quant-ph] Jun. 15, 2021.

Tolpygo, et al., "Process-Induced Variability of Nb/Al/Alox/Nb Junctions in Superconductor Integrated Circuits and Protection Against It", IEEE Transactions On Applied Superconductivity, vol. 19, No. 3, Jun. 2009, 5 pages.

Toplygo, et al., "Wafer Bumping Process and Inter-Chip Connections for Ultra-High Data Transfer Rates in Multi-Chip Modules With Superconductor Integrated Circuits", IEEE Transactions On Applied Superconductivity, 2009, 5 pages.

Tournet, "Growth and Characterization of Epitaxial AI Layers on GaAs and Si Substrates for Superconducting CPW Resonators in Scalable Quantum Computing Systems", Thesis 2015, 161 pages.

Anlage, et al., "A current controlled variable delay superconducting transmission line", IEEE, pp. 1388-1391.

Berkley, et al., "A scalable readout system for a superconducting adiabatic quantum optimization system", arXiv, May 6, 2009, 18 pages.

Dagan, et al., "Absence of Andreev reflections and Andreev bound states above the critical temperature", Phys. Rev. B 61, 2000, 5 pages.

Eom, et al., "A Wideband, Low-Noise Superconducting Amplifier with High Dynamic Range", arXiv, Jan. 11, 2012, 23 pages.

Kerber, et al., "An improved NbN integrated circuit process featuring thick NbN ground plane and lower parasitic circuit inductances", IEEE, Jun. 1997, 6 pages.

Lisitskii, et al., "Annular Josephson junctions for radiation detection: fabrication and investigation of the magnetic behavior", Nuclear Instruments & Methods in Physics Research, Apr. 2000, 11 pages.

Macco, et al., "Atomic-layer deposited $Nb_2O_5$ as transparent passivating electron contact for c-Si solar cells", Science Direct, Sep. 2018, 7 pages.

Nicoletti, et al., "Bi-epitaxial YBCO grain boundary Josephson junctions on $SrTIO_3$ and sapphire substrates", Physica C 269, 1996, 13 pages.

Tolpygo, et al., "Advanced Fabrication Processes for Superconducting Very Large-Scale Integrated Circuits", IEEE. Jan. 19, 2016.

Yoon, et al., "Atomic-scale chemical analyses of niobium oxide/ niobium interfaces via atom-probe tomography", AIP Applied Physics Letters, Oct. 2, 2008, 3 pages.

Non Final Office Action for U.S. Appl. No. 17/429,456, filed Dec. 27. 2023, 23 pages.

Notice of Allowance for U.S. Appl. No. 17/321,819, filed Nov. 8, 2023, 10 pages.

Anton, et al., "Magnetic Flux Noise in dc SQUIDs: Temperature and Geometry Dependence", Physical Review Letters, PRL 110, 147002, Apr. 5, 2013.

B. H. Eom et al., "Wideband, Low-Noise Superconducting Amplifier with High Dynamic Range", arXiv:1201.2392v1 [cond-mat.supr-con], 2012, 23 pages.

Barends R. Enhancement of Quasiparticle Recombination in Ta and Al Superconductors by Implantation of Magnetic and Nonmagnetic Atoms (2009).

Calota, et al., "Investigation of Chemical/Mechanical Polishing of Niobium",, STLE Tribology Transactions, vol. 52(4), p. 447-459, 2009.

Campbell, Wafer-Level Electrically Detected Magnetic Resonance: Magnetic Resonance in a Probing Station (2018).

De Graaf, Supplementary Information, Suppression of low-frequency charge noise in superconducting resonators by surface spin desorption, Nature Communications ( 2019).

Geerlings, "Improving Coherence of Superconducting Qubits and Resonators", A Dissertation Presented to the Faculty of the Graduate School of Yale University, 2012.

Harris et al., "Experimental Demonstration of a Robust and Scalable Flux Qubit," arXiv:0909.4321v1, Sep. 24, 2009, 20 pages.

Johnson et al., "Scalable Control System for a Superconducting Adiabatic Quantum Optimization Processor," arXiv:0907.3757v2. Mar. 24, 2010. 14 pages.

Sendelbach, et al., "Complex Inductance, Excess Noise, and Surface Magnetism in dc SQUIDs", Physical Review Letters 103, 117001, Sep. 11, 2009.

Sun, Self-Aligned 3D Chip Integration Technology and Through-Silicon Serial Data Transmission (2011).

Tafuri, Feasibility of Biepitaxial YbaCuO Josephson Junctions for Fundamental Studies and Potential Circuit Implementation, Los Alamos National Laboratory preprint server condmat, 21 pages. Oct. 9, 2000.

Tezcan, Sloped Throught Wafer Vias for 3D Wafer Level Packaging (2007).

Wu Banqiu, High Aspect Ratio Silicon Etch: A Review (2010).

Yoon, K., et al. "Atomic-Scale Chemical Analyses of Niobium Oxide/Niobium Interfaces via Atom-Probe Tomography," Applied Physics Letters, vol. 93, 2008, 3 pages.

Ex Parte Quayle Issued in U.S. Appl. No. 17/158,484, filed Jan. 19, 2024, 9 pages.

Ramos et al., "Design for Effective Thermalization of Junctions for Quantum Coherence," IEEE Transactions on Applied Superconductivity 11(1):998-1001, Mar. 2001.

Racah et al., "Properties of normal metal/dielectric/high-Tcjunctions obtained by in-situ oxidation", Physica C 263, 1996.

Campbell, et al., "Electron Spin Resonance Scanning Probe Spectroscopy for Ultrasensitive Biochemical Studies", Analytical Chemistry Publications, Anal. Chem. 2015, 87, 4910-4915, 7 pages.

Dhakal, et al., "Flux expulsion in niobium superconducting radio-frequency cavities of different purity and essential contributions in the flux sensitivity", arXiv:1906.04163, Pub. Jun. 6, 2019.

Henry, et al., "Degradation of Superconducting Nb/NbN Films by Atmospheric Oxidation", IEEE Transactions on Applied Superconductivity, IEEXplore, 1051-8223, 2017, 5 pages.

Hu, "Advanced Composites Material" pp. 197-201—Chinese, 2019.

Martinis, et al., "Decoherence in Josephson Qubits from Dielectric Loss", arXiv:cond-mat/0507622v1 [cond-mat.mtrl-sci] Jul. 26, 2005.

Semenov, et al., "How Moats Protect Superconductor Films from Flux Trapping", IEEE Transactions on Applied Superconductivity, 1051-8223, 2016 IEEE, 20 pages.

Semenov., "AC-Biased Shift Registers as Fabrication Process Benchmark Circuits and Flux Trapping Diagnostic Tool", arXiv:1701.03837, Published Dec. 29, 2016, 9 pages.

D-Wave Whitepaper, Early Progress on Lower Noise, 2022.

Fritzsch et al., "SNS and SIS Josephson junctions with dimensions down to the sub-um region prepared by an unified technology," Supercond. Sci. Tech. 12: 880-882, 1999.

Gao et al., A Semiempirical Model For Two Level System Noise In Superconducting Microresonators, Applied Physics, 2008.

International Search Report and Written Opinion, mailed Oct. 13, 2021. for PCT/US2021/038519, 9 pages.

Kauppinen, et al., "Coulomb Blockade Thermometer: Tests and Instrumentation", Review of Scientific Instruments, vol. 69, #12, 1998.

Kosen, et al., "Building Blocks of a Flip Chip Integrated Superconducting Quantum Processor", arXiv 2112.02717v2, 2022.

Lee, "The Feasibility of Au Bonding on SN-Plated Cu", Journal of Electronic Materials, 2007.

Logothetidis, et al., "Room Temperature Oxidation Behavior of TiN Thin Films", 1999.

Luo, "Superconductivity In Noble-Metal-Rich Hexagonal Close-Packed Phases", 1970.

McCrory, et al., "Wafer-Level Electrically Detected Magnetic Resonance: Magnetic Resonance In A Probing Station", 2018.

McIntyre, "The Effect Of Annealing And Heating Deposition On Alpha And Beta Phase Formation For Tantalum Thin Films", 2018.

Narkowicz, et al., "Planar Microresonators For EPR Experiments", Science Direct, 2005.

Ni, et al., "Demonstration Of Tantalum As A Structural Material For MEMS Thermal Actuators", 2021.

(56) References Cited

OTHER PUBLICATIONS

Non-Final Office Action Issued in U.S. Appl. No. 16/870,537, filed Jul. 19, 2023, 9 pages.
Shoji et al., "New fabrication process for Josephson tunnel junctions with (niobium nitride, niobium) double-layered electrodes," Appl. Phys. Lett. 41(11): 1097-1099, Dec. 1, 1982.
Veinger, "Technique For Magnetic Susceptibility Determination in the High Doped Semiconductors by Electron Spin Resonance", 2013.
Vladoiu, "Growth and Characteristics of Tantalum Oxide Thin Films Deposited Using Thermionic Vacuum Arc Technology", 2010.
Wang, "Towards Practical Quantum Computers: Transmon Qubit With a Lifetime Approaching 0.5 Milliseconds", 2022.
Zednicek, "Niobium and Niobium Oxide Capacitors Overview", 2019.
Zhang, et al., "Characterization of Surface Oxidation Layers On Ultrathin NvTiN Films", 2018.
Muller et al., "Towards understanding two-level-systems in amorphous solids—Insights from quantum circuits", arXiv:1705.01108v3, Oct. 10, 2019.
Makhlin et al., "Quantum-state engineering with Josephson-junction devices," Reviews of Modern Physics 73 (2):357-400, Apr. 2001.
Malissa et al., "Superconducting coplanar waveguide resonators for low temperature pulsed electron spin resonance spectroscopy", Review of Scientific Instruments, Feb. 1, 2013.
Martens et al., "Sparameter measurements on singe superconducting thin-film three-terminal devices made of high-Tc and low-Tc materials", J. Appl. Phys. 65, 1989.
Mason, "Surface Impedance of Thin Superconducting Films", California Institute of Technology, 1962.
McRae et al., "Materials loss measurements using superconducting microwave resonators", arXiv:2006.04718 [physics, physics:quant-ph], Sep. 1, 2000.
Mooij et al., "Josephson Persistent-Current Qubit," Science 285:1036-1039, Aug. 13, 1999.
Morton & Bertet, "Storing quantum information in spins and high-sensitivity ESR", Journal of Magnetic Resonance, 287:128-139, Feb. 1, 2018.
N/A, "Antifuse", Wikipedia, Nov. 16, 2019.
N/A, "Low-k dielectric", Wikipedia, Apr. 14, 2020.
Niepce et al., "Geometric scaling of two-level-system loss in superconducting resonators", Superconducting Science and Technology, 33(2):025013, Jan. 1, 2020.
NSA, "Superconducting Technology Assessment", National Security Agency Office of Corporate Assessments, Aug. 1, 2005, 257 pages.
Office Action in Application No. 2019-562235, mailed Mar. 11, 2022 (English translation, 5 pages).
Oliver et al., "MRS Bulletin" vol. 38, pp. 816-825 (2013).
Peltonen, J.T., et al., "Hybrid rf SQUID qubit based on high kinetic inductance," Scientific Reports, Jul. 3, 2018, 8 pages.
Place et al., "New material platform for superconducting transmon qubits with coherence times exceeding 0.3 milliseconds", arXiv, Feb. 28, 2020.
Place et al., "Supplementary Materials for New material platform for superconducting transmon qubits with coherence times exceeding 0.3 milliseconds", Feb. 1, 2021.
Ramzi et al., "Niobium and Aluminum Josephson Junctions Fabricated with a Damascene CMP Process", Physics Procedia, vol. 36, 2012, p. 211-216.
Schulz et al., "Design and realization of an all d-wave do pi-superconducting quantum interference device", Appl. Phys. Lett. 76, 2000.
Schuster et al., "High cooperativity coupling of electron-spin ensembles to superconducting cavities", Physical Review Letters, 105(14):140501. Sep. 1, 2010.
Sears, "Extending Coherence in Superconducting Qubits: from microseconds to milliseconds", PhD thesis, Yale, Jan. 1, 2013.
Sigillito et al., "Fast, low-power manipulation of spin ensembles in superconducting microresonators", Applied Physics Letters, 104(22):222407, Jun. 1, 2014.
Sun et al., "Direction of tunneling in Pb/ I/YBa2Cu3O7-x tunnel junctions", Phys Rev B 54, 1996.
Swenson et al., "Operation of a titanium nitride superconducting microresonator detector in the nonlinear regime," arXiv:1305.4281v1 [cond-mat.supr-con], May 18, 2013, 11 pages.
Tokunaga et al., "SiO2 passivation film effects on YBCO junctions", Science Direct, Sep. 10, 1998.
Tolpygo et al., "Advanced Fabrication Processes for Superconducting Very Large Scale Integrated Circuits," IEEE Transactions on Applied Superconductivity 26(3):1-10, Jan. 19, 2016.
Tolpygo et al., "Deep sub-micron stud-via technology of superconductor VLSI circuits," Supercond. Sci. Technol. 27:1-9, Jan. 14, 2014.
Valles et al., "Electron tunneling into single crystals of YBa2Cu3O7-$\delta$", Phys. Rev. B 44, 1991.
Verjauw et al., "Investigation of microwave loss induced by oxide regrowth in high-Q Nb resonators", Physical Review Applied, p. 16, Jan. 1, 2020.
VLSI-expert.com, "Parasitic Interconnected Corner (RC corner) Basics—Part 1", hhtp:www.visi-expert.com/2012/02/ parasitic-interconnected-corner-rc-corner.html, Feb. 12, 2012 (Year:2012), 7 pages.
Voesch et al., "On-Chip ESR Measurements of DPPH at mK Temperatures", Physics Procedia, 75:503-510, Jan. 1, 2015.
Voss et al., "Submicron Nb-Al-oxide-Nb junctions for frequency mixers", Superconductor Science and Technology 6, 1993.
Wallace & Silsbee, "Microstrip resonators for electron-spin resonance", Review of Scientific Instruments, 62 (7):1754-1766, Jul. 1, 1991.
Wang et al., "FTIR Characterization of Fluorine Doped Silicon Dioxide Thin Films Deposited by Plasma Enhanced Chemical Vapor Deposition", IOP Science, Apr. 21, 2000.
Weichselbaumer et al., "Quantitative modeling of superconducting planar resonators with improved field homogeneity for electron spin resonance", Physical Review Applied, 12(2):024021, Aug. 1, 2019.
Winkel, "Implementation of a transmon qubit using superconducting granular aluminum", arXiv, Nov. 7, 2019.
Woods et al., "Determining interface dielectric losses in superconducting coplanar waveguide resonators", arXiv:1808.10347 [cond-mat,physics:quant-ph], Aug. 1, 2018.
Written Opinion for PCT/US2018/016237, mailed Jul. 2, 2018, 30 pages.
Written Opinion for PCT/US2020/018137, mailed Jun. 3, 2020, 10 pages.
Tolpygo, Sergey K., et al., "Superconductor Electronics Fabrication Process with MoNx Kinetic Inductors and Self-Shunted Josephson Junctions," IEEE Transactions on Applied Superconductivity 28(4), Jun. 2018, 12 pages.
Whittaker, J.D., et al., "A frequency and sensitivity tunable microresonator array for high-speed quantum," arXiv:1509.05811v2 [quant-ph], Apr. 22, 2016, 8 pages., Apr. 22, 2016.
Barends, et al., "Superconducting quantum circuits at the surface code threshold for fault tolerance", Nature vol. 508, pp. 500-503 (2014).
Blatter et al., "Design aspects of superconducting-phase quantum bits," Physical Review B 63: 174511-1-174511-9, 2001.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Calusine et al., "Analysis and mitigation of interface losses in trenched superconducting coplanar wave resonators", Applied Physics Letters, 112(6):062601, Feb. 1, 2018.
Cava, et al., "Electrical and magnetic properties of Nb2O5- crystallographic shear structures", Phys. Rev. B44, 6973—Published Oct. 1, 1991.
Clauss et al., "Broadband electron spin resonance from 500 MHz to 40 GHz using superconducting coplanar waveguides", Applied Physics Letters, Apr. 1, 2013.

(56) References Cited

OTHER PUBLICATIONS

Clauss et al., "Optimization of Coplanar Waveguide Resonators for ESR Studies on Metals", Journal of Physics: Conference Series, Mar. 1, 2015.
Daalmans, "HTS DC SQUIDs for practical applications", Science Direct, Jul. 1, 1995.
De Graaf et al., "Direct Identification of Dilute Surface Spins on Al2O3: Origin of Flux Noise in Quantum Circuits", Physical Review Letters, Jan. 1, 2017.
De Graaf et al., "Suppression of low-frequency charge noise in superconducting resonators by surface spin desorption", Nature Communications, 9(1):1143, Dec. 1, 2018.
Diniz et al., "Intrinsic photon loss at the interface of superconducting devices", arXiv, Mar. 10, 2020.
Doerner, S., et al., "Compact microwave kinetic inductance nanowire galvanometer for cryogenic detectors at 4.2 K," J. Phys. Commun., 2018, 8 pages.
Extended European Search Report for EP 18747996.5, dated Sep. 3, 2020, 8 pages.
Friedrich et al., "Onset of phase diffusion in high kinetic inductance granular aluminum micro-SQUIDs", arXiv, Aug. 29, 2019.
Gao et al., "Experimental evidence for a surface distribution of two-level systems in superconducting lithographed microwave resonators", Applied Physics Letters, 92(15): 152505, Apr. 1, 2018.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Hinode et al., "Fabrication of reliable via conductors for niobium SFQ devices," Physica C 426-431:1533-1540, 2005.
Holzman et al., "On-chip integrable planar NbN nanoSQUID with broad temperature and magnetic-field operation range", AIP Advances, Oct. 23, 2019.
Hori et al., "Electron spin resonance study on pure single crystalline sapphire", P hys. Status Solidi C 10, No. 12. 1681-1683 (Nov. 5, 2013).
Hunt et al., "NbN/MgO/NbN edge-geometry tunnel junctions", Applied Physics Letters 55, 1982.
International Search Report for PCT/US2018/016237, mailed Jul. 2, 2018, 6 pages.
International Search Report for PCT/US2020/018137, mailed Jun. 3, 2020, 4 pages.
Japanese Office Action for Japanese Patent Application No. 2020-073654, mailed Aug. 17, 2021 (with English Translation) 5 pages.
Johnson et al., "Scalable Control System for a Superconducting Adiabatic Quantum Optimization Processor," Superconductor Science & Technology (2010).
Kwon et al., "Magnetic Field Dependent Microwave Losses in Superconducting Niobium Microstrip Resonators"; Journal of Applied Physics, 124(3):033803, Jul. 1, 2018.
Lanting et al., "Evidence for temperature-dependent spin diffusion as a mechanism of intrinsic flux noise in SQUIDs", Physical Review B 89, 014503 (Jan. 7, 2014).
Lanting et al., "Geometrical dependence of the low-frequency noise in superconducting flux qubits", Physical Review B, 79, 060509, Jun. 5, 2009, 4 pages.
Levy-Bertrand et al., "Electrodynamics of granular aluminum from superconductor to insulator: observation of collective superconducting modes", arXiv, Mar. 13, 2019.
Lomatch et al., "Multilayer Josephson Flux Quantum Devices," IEEE Trans. Appl. Superconductivity, vol. 5, No. 2, Jun. 2, 1995.
Lucero, "Computing prime factors using a Josephson phase-qubit architecture: 15 = 3 × 5", A dissertation submitted in partial satisfaction of the requirements for the degree of Doctor of Philosophy in Physics, University of California Santa Barbara.
Il'ichev, et al. "Degenerate ground state in a mesoscopic YBa2Cu3O7-x grain boundary Josephson junction", Physical Review Letters, vol. 86, No. 23, Jun. 4, 2001, 4 pages.
Annunziata , et al., "Tunable superconducting nanoinductors", IOP Science, Oct. 15, 2010, 11 pages.
Balashov , et al., "Superconductor-insulator-normal-conductor-insulator-superconductor process development for integrated circuit applications", IOP Science, Dec. 1, 1998, 11 pages.
Bruder , et al., "Tunnel junctions of Unconventional Superconductors", Physical Review, 1995, 5 pages.
Larsson , et al., "Transport properties of submicron YBa2Cu3O7-d step-edge Josephson junctions", J. Appl. Phys. 90, 2001, 24 pages.
Lombardi , et al., "Tunnel barriers for an all-high-Tc single electron tunneling transistor", Physica C 368, 2002, 6 pages.
Martinis , et al., "UCSB final report for the CSQ program: Review of decoherence and materials physics for superconducting qubits", arXiv, Oct. 21, 2014, 10 pages.
Mazin , et al., "Thin film dielectric microstrip kinetic inductance detectors", arXiv, Feb. 1, 2010, 10 pages.
Ortlepp , et al., "RSFQ Circuitry Using Intrisic π-Phase Shifts", IEEE, Jun. 2007, 5 pages.
Schrieffer , et al., "Superconductivity", Rev. Mod. Phys., 71, 1999, 5 pages.
Sigrist , et al., "Unusual paramagnetic phenomena in granula high-temperature superconductors—A consequence of d-wave - pairing?", Rev. Mod. Phys. 67, 1995, 5 pages.
Smilde , et al., "Y-Ba-Cu-O / Au / Nb Ramp-type Josephson Junctions", IEEE, 2001, 5 pages.
Tanaka , et al., "Theory of Josephson effects in anisotropic superconductor", Physical Review B 56, 1997, 21 pages.
Tolpygo , "Superconductor Digital Electronics: Scalability and Energy Efficiency Issues", arXiv, Feb. 10, 2016, 20 pages.
Tosi, et al., "Silicon quantum processor with robust long-distance qubit couplings", Nature, Sep. 6, 2017, 11 pages.

\* cited by examiner

SYSTEMS AND METHODS FOR ON-CHIP NOISE MEASUREMENTS

FIELD

This disclosure generally relates to systems and methods for measuring noise in discrete regions of multi-layer superconducting integrated circuits.

BACKGROUND

Superconducting Processor

A quantum processor may take the form of a superconducting processor. However, superconducting processors can include processors that are not intended for quantum computing. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present articles and methods are particularly well-suited for use in fabricating both superconducting quantum processors and superconducting classical processors.

Superconducting Qubits

Superconducting qubits are a type of superconducting quantum device that can be included in a superconducting integrated circuit. Superconducting qubits can be separated into several categories depending on the physical property used to encode information. For example, superconducting qubits may be separated into charge, flux and phase devices. Charge devices store and manipulate information in the charge states of the device. Flux devices store and manipulate information in a variable related to the magnetic flux through some part of the device. Phase devices store and manipulate information in a variable related to the difference in superconducting phase between two regions of the device. Recently, hybrid devices using two or more of charge, flux and phase degrees of freedom have been developed. Superconducting qubits commonly include at least one Josephson junction. A Josephson junction is a small interruption in an otherwise continuous superconducting current path and is typically realized by a thin insulating barrier sandwiched between two superconducting electrodes. Thus, a Josephson junction may be implemented as a three-layer or "trilayer" structure. Superconducting qubits are further described in, for example, U.S. Pat. Nos. 7,876,248, 8,035,540, and 8,098,179.

Integrated Circuit Fabrication

Superconducting integrated circuits are often fabricated with tools that are traditionally used to fabricate semiconductor chips or integrated circuits. Due to issues unique to superconducting circuits, not all semiconductor processes and techniques are necessarily transferrable to superconductor chip manufacture. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Any impurities within superconducting chips may result in noise which can compromise or degrade the functionality of the individual devices, such as superconducting qubits, and of the superconducting chip as a whole. Since noise is a serious concern to the operation of quantum computers, measures should be taken to reduce noise wherever possible.

Hamiltonian Description of a Quantum Processor

In accordance with some embodiments of the present articles and methods, a quantum processor may be designed to perform adiabatic quantum computation and/or quantum annealing. A common problem Hamiltonian includes first component proportional to diagonal single qubit terms and a second component proportional to diagonal multi-qubit terms. The problem Hamiltonian, for example, may be of the form:

$$H_P \propto -\frac{\varepsilon}{2}\left[\sum_{i=1}^{N} h_i \sigma_i^z + \sum_{ji}^{N} J_{ij}\sigma_i^z\sigma_j^z\right]$$

where N represents the number of qubits, $\sigma_i^z$ is the Pauli z-matrix for the $i^{th}$ qubit, $h_i$ and are dimensionless local fields for the qubits, and couplings between qubits, and $\varepsilon$ is some characteristic energy scale for Hp. Here, the $\sigma_i^z$ and $\sigma_i^z\sigma_j^z$ terms are examples of "diagonal" terms. The former is a single qubit term and the latter a two qubit term. Hamiltonians may be physically realized in a variety of different ways, for example, by an implementation of superconducting qubits.

Noise in a Quantum Processor

Low-noise is a desirable characteristic of quantum devices. Noise can compromise or degrade the functionality of the individual devices, such as superconducting qubits, and of the superconducting processor as a whole. Noise can negatively affect qubit coherence and reduce the efficacy of qubit tunneling. Since noise is a serious concern to the operation of quantum processors, measures should be taken to reduce noise wherever possible so that a transition from coherent to incoherent tunneling is not induced by the environment.

Impurities may be deposited on the metal surface and/or may arise from an interaction with the etch/photoresist chemistry and the metal. Noise can be caused by impurities on the upper surface of the quantum processor. In some cases, superconducting devices that are susceptible to noise are fabricated in the top wiring layers of a superconducting integrated circuit and are thus sensitive to post-fabrication handling. There is a risk of introducing impurities that cause noise during post-fabrication handling. One approach to reducing noise is using a barrier passivation layer, for example, an insulating layer, to overlie the topmost wiring layer. The use of a barrier passivation layer to minimize noise from impurities on the upper surface of a quantum processor is described in US Patent Application No. Publication 2018/02219150A1.

Noise can also result from an external environment or surrounding circuitry in a superconducting processor. In a quantum processor, flux noise on qubits interferes with properly annealing the quantum processor because of the steep transition between qubit states as the flux bias is swept. Flux noise can be a result of current flowing through wiring of other devices included in the superconducting processor and can have a particularly negative effect on qubits at their respective degeneracy points. For example, flux noise can introduce errors in calculations carried out by the superconducting processor due to inaccuracies in setting flux bias and coupling strength values. Reducing or even eliminating such inaccuracies may be particularly advantageous in using an integrated circuit as part of a quantum processor. Much of the static control error can be designed out of the processor with careful layout and high-precision flux sources, as well as by adding circuitry, such as an on-chip shield, to tune away any non-ideal flux qubit behavior. However, in many cases, limitations in integrated circuit fabrication capabilities can make it difficult to address noise by changing processor layout and adding circuitry. There is therefore a general desire for articles and methods for fabricating integrated circuits that have reduced flux noise (and thus improved coherence) without having to compromise the quantum processor layout by adding additional layers or circuitry.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

A method of conducting spatial noise measurements in a superconducting fabrication stack is described. The superconducting fabrication stack comprises one or more material interfaces. The method comprising: identifying one or more spatial regions of the superconducting fabrication stack; generating a plurality of resonator geometries; fabricating a plurality of resonators on the superconducting fabrication stack, each resonator of the plurality of resonators having a respective one of the plurality of resonator geometries; measuring data from the plurality of resonators; calculating fill fractions for the one or more spatial regions of the superconducting fabrication stack based on the data measured from the plurality of resonators; and determining a spin density for each spatial region of the one or more spatial regions of the superconducting fabrication stack based on the data measured from the plurality of resonators and the calculated fill fractions. Measuring data from the plurality of resonators comprises measuring spectra of each resonator in the plurality of resonators using on-chip electron-spin resonance (cESR). The resonators may be coplanar waveguide resonators. Each resonator has a respective resonance frequency. The method may further comprise measuring the resonator geometries via scanning electron microscope (SEM) after fabricating the plurality of resonators. As many resonator geometries are generated as identified spatial regions. The one or more spatial regions comprise at least one of: niobium, aluminum, tantalum, niobium nitride, titanium nitride, or niobium titanium nitride. The one or more spatial regions comprise at least the one or more material interfaces. Resonators are fabricated on a metal layer overlying a dielectric layer in the superconducting fabrication stack. Resonators may be etched on a metal layer overlying a dielectric layer in the superconducting fabrication stack.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, digital computer systems, analog computer systems, and/or fabrication equipment have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Hybrid Quantum Computing Systems

Figure 1:
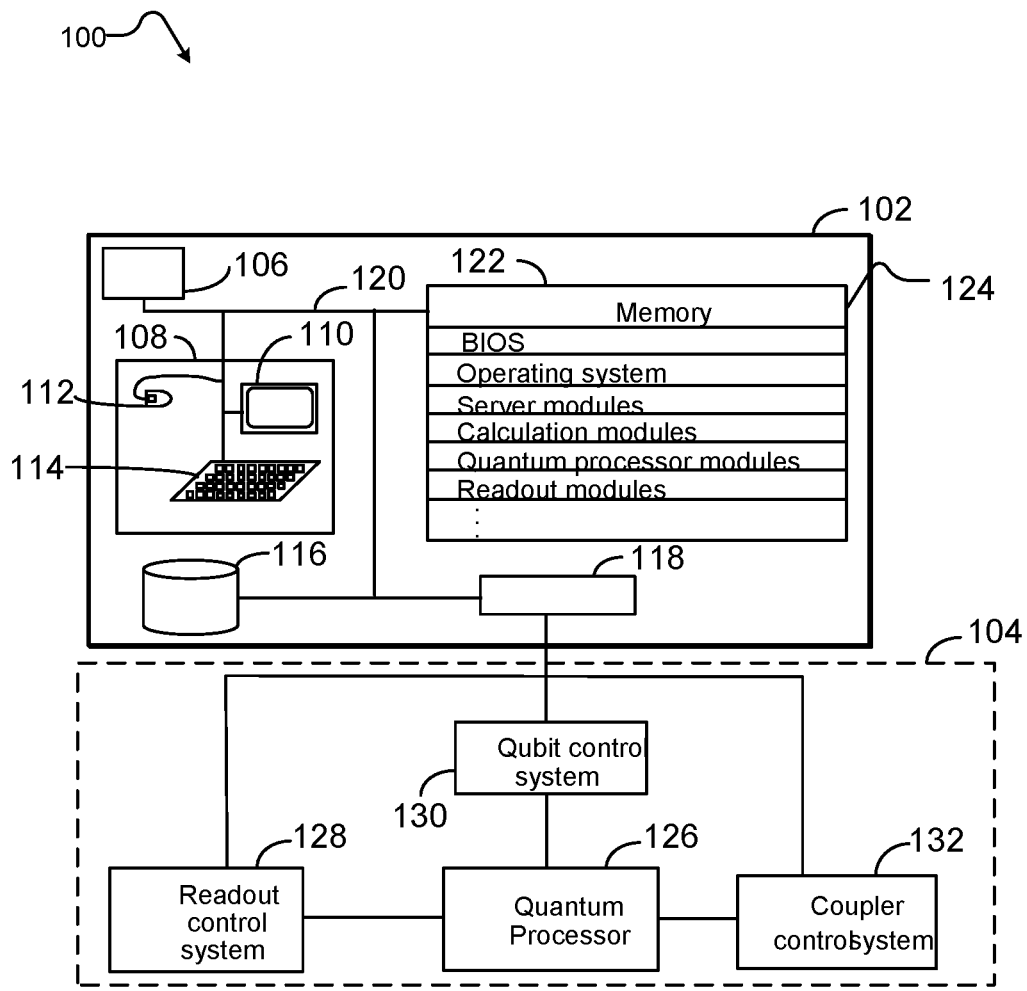
FIG. 1 is a schematic diagram that illustrates a computing system comprising a digital computer and an analog computer that includes a superconducting integrated circuit, in accordance with the present systems and methods.

FIG. 1 illustrates a computing system 100 comprising a digital computer 102. The example digital computer 102 includes one or more digital processors 106 that may be used to perform classical digital processing tasks. Digital computer 102 may further include at least one system memory 122, and at least one system bus 120 that couples various system components, including system memory 122 to digital processor(s) 106. System memory 122 may store one or more sets of processor-executable instructions, which may be referred to as modules 124.

The digital processor(s) 106 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 100 comprises an analog computer 104, which may include one or more quantum processors 126. Quantum processor 126 may include at least one superconducting integrated circuit. Digital computer 102 may communicate with analog computer 104 via, for instance, a controller 118. Certain computations may be performed by analog computer 104 at the instruction of digital computer 102, as described in greater detail herein.

Digital computer 102 may include a user input/output subsystem 108. In some implementations, the user input/output subsystem includes one or more user input/output components such as a display 110, mouse 112, and/or keyboard 114.

System bus 120 may employ any known bus structures or architectures, including a memory bus with a memory controller, a peripheral bus, and a local bus. System memory 122 may include non-volatile memory, such as read-only memory ("ROM"), static random-access memory ("SRAM"), Flash NAND; and volatile memory such as random-access memory ("RAM") (not shown).

Digital computer 102 may also include other non-transitory computer- or processor-readable storage media or non-volatile memory 116. Non-volatile memory 116 may take a variety of forms, including: a hard disk drive for reading from and writing to a hard disk (for example, a magnetic disk), an optical disk drive for reading from and writing to removable optical disks, and/or a solid state drive (SSD) for reading from and writing to solid state media (for example NAND-based Flash memory). Non-volatile memory 116 may communicate with digital processor(s) via system bus 120 and may include appropriate interfaces or controllers 118 coupled to system bus 120. Non-volatile memory 116 may serve as long-term storage for processor- or computer-readable instructions, data structures, or other data (sometimes called program modules or modules 124) for digital computer 102.

Although digital computer 102 has been described as employing hard disks, optical disks and/or solid-state storage media, those skilled in the relevant art will appreciate that other types of non-transitory and non-volatile computer-readable media may be employed. Those skilled in the relevant art will appreciate that some computer architectures employ non-transitory volatile memory and non-transitory non-volatile memory. For example, data in volatile memory may be cached to non-volatile memory or a solid-state disk that employs integrated circuits to provide non-volatile memory.

Various processor- or computer-readable and/or executable instructions, data structures, or other data may be stored in system memory 122. For example, system memory 122 may store instructions for communicating with remote clients and scheduling use of resources including resources on the digital computer 102 and analog computer 104. Also, for example, system memory 122 may store at least one of processor executable instructions or data that, when executed by at least one processor, causes the at least one processor to execute the various algorithms to execute instructions. In some implementations system memory 122 may store processor- or computer-readable calculation instructions and/or data to perform pre-processing, co-processing, and post-processing to analog computer 104. System memory 122 may store a set of analog computer interface instructions to interact with analog computer 104. For example, the system memory 122 may store processor- or computer-readable instructions, data structures, or other data which, when executed by a processor or computer causes the processor(s) or computer(s) to execute one, more or all of the acts of method 200 of FIG. 2.

Analog computer 104 may include at least one analog processor such as quantum processor 126. Analog computer 104 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 104 may include programmable elements such as qubits, couplers, and other devices (also referred to herein as controllable devices). Qubits may be read out via readout system 128. Readout results may be sent to other computer- or processor-readable instructions of digital computer 102. Qubits may be controlled via a qubit control system 130. Qubit control system 130 may include on-chip Digital to Analog Converters (DACs) and analog lines that are operable to apply a bias to a target device. Couplers that couple qubits may be controlled via a coupler control system 132. Coupler control system 132 may include tuning elements such as on-chip DACs and analog lines. Qubit control system 130 and coupler control system 132 may be used to implement a quantum annealing schedule on analog computer 104. Programmable elements may be included in quantum processor 126 in the form of an integrated circuit. Qubits and couplers may be positioned in layers of the integrated circuit that comprise a first material. Other devices, such as readout control system 128, may be positioned in other layers of the integrated circuit that comprise a second material. In accordance with the present disclosure, a quantum processor, such as quantum processor 126, may be designed to perform quantum annealing and/or adiabatic quantum computation. Examples of quantum processors are described in U.S. Pat. No. 7,533,068.

Various respective systems, components, structures and algorithms for implementing such are described herein. Many of the described systems, components, structures and algorithms may be implemented individually, while some may be implemented in combination with one another.

A quantum processor may require a local bias to be applied on a qubit to implement a problem Hamiltonian. The local bias applied on the qubit depends on persistent current $I_P$ and external flux bias $\phi_q$ as described below:

$$\delta h_i = 2|I_P|\delta\phi_q$$

Noise affects the local bias $\delta h_i$ in the same way as the external flux bias $\phi_q$ and thus changes the specification of the qubit terms in the problem Hamiltonian. Noise may introduce errors into the computational result from quantum annealing by altering the problem Hamiltonian.

Throughout the present specification, the phrase 'noise-susceptible device' is used to describe a device for which noise may adversely affect the proper performance in a quantum processor. Poor performance of a noise-susceptible device may result in the quantum processor producing inaccurate or suboptimal solutions to a problem. For example, a qubit may be considered a noise-susceptible device or device that is susceptible to noise because noise on the qubits may interfere with properly annealing the quantum processor and/or can lead to a different problem being solved. Note that the phrase "noise-susceptible" or "susceptible to noise" does not necessarily suggest that the device itself is physically more or less sensitive to noise compared to other devices that are not described as noise-susceptible. Sensitivities to processor performance is higher in noise-susceptible devices relative to devices that are described as less susceptible to noise.

Noise in a quantum processor may cause qubits to decohere which reduces the efficacy of tunneling. As a result, processor performance may be diminished, and solutions generated from the processor may be suboptimal.

Performance of a superconducting processor can be directly impacted by the performance of certain superconducting devices that are susceptible to noise, for example, qubits and couplers. Since processor performance is particularly sensitive to the outcomes of operation of these devices, it is desirable to reduce noise in these devices as much as possible. For a superconducting processor, one of the dominant sources of environmental noise is flux noise. Flux noise is thought to be a stochastic process generated by magnetic defects, or magnetic spins, in materials. These may also be referred to as "spin defects". Flux noise may cause decoherence which induces a transition from coherent to incoherent tunneling before intrinsic phase transitions can be induced by processor dynamics (e.g., from a programmed problem). Device decoherence during computation may limit accuracy with which the processor evolves and produces solutions. Additionally, flux noise may increase the susceptibility of a processor to spin bath polarization which is a "memory" effect that results in diminished sampling and optimization performance. Systems and methods to reduce spin bath polarization are described in U.S. Pat. No. 11,295, 225.

Therefore, in many implementations, it is beneficial to understand the origin of various types of noise in a materials stack. For instance, in a fabrication stack, the dominant noise may be flux noise that originates from one or more of spin defects in the wires, the wire-dielectric interface, or the dielectric material. In order to determine the source of this flux noise, it can be beneficial to spatially identify the layers or interfaces having high-defect densities (e.g., spin defects) before investing significant resources on fabrication development in an effort to reduce noise. In an example implementation of the development of a fabrication stack for a quantum processor, it is advantageous to resolve the source of noise from among noise in a dielectric, noise at the surface of wiring, or noise at the interfaces between wiring and dielectric regions.

A spin density for a system can be determined by forming a single superconducting micro resonator and performing electron spin resonance (ESR) at milli-Kelvin temperatures. Methods, systems, and apparatus discussed herein provide for measuring on-chip electron spin resonance (cESR) spectrum on several resonators with different geometries and analyzing the data to extract the spin density for each region. This can beneficially allow for distinguishing noise parameters of different regions, and in particular noise parameters of different materials and interfaces. In the present disclosure and the appended claims, the terms 'resonator geometry' or 'resonator geometries' are used to define any change in a resonator that will alter a magnetic field distribution in the material system. An example of changing a resonator geometry is altering the cross section (e.g., the width between the ground plates and the center conductor of a resonator, or the width of the center conductor). Another example of a resonator geometry change is etching trenches of different depths between the center conductor and the ground plates. Resonators will operate at a characteristic frequency that is determined by the resonator geometry. By providing a set or plurality of resonators, each having a different resonator geometry, the signals from each resonator can be distinguished. That is, each resonator will provide a distinct signal as it has a different characteristic frequency.

Development of multi-layer fabrication stacks is a complex process having a landscape of variables, the values of which can be adjusted towards the goal of achieving lower noise processors, and thereby more performant processors, and, preferably, more accurate computation performed by quantum processors. Some of these variables include the number of layers within a fabrication stack, the thickness of relative layers, the material of each layer, and the material interfaces between layers. These variables may be interrelated, and a trial and error approach in fabrication can be costly and time consuming. While factors such as paramagnetic defect density in a given dielectric may be thought to be a source of noise, it may be the case that spin defects in the metal layers (e.g., conductive traces or wires) or at material interfaces (e.g., wire-dielectric interfaces) dominate the noise. The methods, systems, and apparatuses described herein can beneficially characterize high defect densities in spatial regions to determine dominate sources of noise, which in turn can provide more efficient fabrication processes. In particular, measuring cESR spectrum on several resonators with different geometries allows for extracting spatially-resolved spin densities. This in turn allows for differentiation in noise between different portions of a fabrication stack.

An example superconducting fabrication stack comprises a substrate, a dielectric, and a superconductor. The superconducting fabrication stack may be used to design a superconducting integrated circuit, for example a superconducting processor (e.g., a superconducting quantum processor comprising qubits and couplers). Examples of superconducting fabrication stacks are discussed in FIGS. 3 and 4. The systems and methods described in the present disclosure use co-planar waveguide (CPW) resonators of several different geometries measured at milli-kelvin temperature with and without the presence of a large magnetic field.

Charge Noise Measurements with Co-Planar Waveguide (CPW) Resonators

One method that has been used to understand noise in superconducting integrated circuits was first developed at NASA's Jet Propulsion Laboratory; see J. Gao et al., "Experimental evidence for a surface distribution of two-level systems in superconducting lithographed microwave resonators," *Appl. Phys. Lett.*, vol. 92, 2008. The method requires CPW resonators and involves varying the CPW center trace width, $s_r$, and ground plane gap, $g_r$, to extract the amount of loss in the bulk substrate dielectric, the metal-substrate interface, the metal-vacuum interface, and the substrate-vacuum interface. This method was further demonstrated at MIT using Titanium Nitride (TiN) on high-resistivity c-Silicon wafers; see G. Calusine et al., "Analysis and mitigation of interface losses in trenched superconducting coplanar waveguide resonators," *Appl. Phys. Lett.*, vol 112, 2018 and W. Woods et al., "Determining interface dielectric losses in superconducting coplanar waveguide resonators," *Phys. Rev. Applied*, 12, 2019. In these demonstrations, the $s_r/g_r$ ratio was kept constant, and etched trenches of different depths in the gaps to vary the geometry further. By using electro-magnetic (EM) field analysis they calculated the spatial variation of the electric and magnetic fields. The field distribution can be used to calculate the electric field fill fraction $F_{region}$ for a given region, also called the 'fill factor' or 'filling factor':

$$F_{region} = \frac{U_{region}}{U_{total}} = \frac{\int_{V_{region}} \varepsilon_{region} \vec{E}^2(\vec{r}) d\vec{r}}{\int_{V_{total}} \varepsilon_{effective} \vec{E}^2(\vec{r}) d\vec{r}} \quad (1)$$

where U is the electric field energy, V is the volume, $\varepsilon$ is the dielectric constant, E is the electric field and r is the vector in space. As such, the fill fraction can be thought of as the proportion of the electrical energy that is stored in a given region.

By fitting to models of how each region's fill fraction changes with each geometry variation, Woods et al. were able to resolve each of these different interfaces (silicon substrate (Si), metal substrate interface (MS), substrate air (SA), and metal air (MA)) and provide a loss tangent (tan δ) for each. Woods et al. used modeling to calculate the fill fraction Frey ion for each region in each geometry, where Equation 2 is the form of one equation for one geometry in a system of linear equations that can be solved, given enough geometry variations.

$$\tan \delta_{measured} = F_{Si} \tan \delta_{Si} + F_{MS} \tan \delta_{MS} + F_{SA} \tan \delta_{SA} + F_{MA} \tan \delta_{MA} \quad (2)$$

Calusine et al. used seven different trench depths and five different geometries, providing more than enough geometry variation to extract their four unknowns in Equation 2. Calusine et al. measured sixty devices on twelve chips and obtained statistical results via Monte Carlo error analysis.

In contrast with the above, it may be beneficial to measure flux or parametric defect noise for different spatial regions of a fabrication stack in order to better select materials for fabricating superconducting integrated circuits such as quantum processors. The following is a demonstrative example: if one builds four resonators, labeled R1 through R4, with different geometries on the same chip and measures the loss tangent of each resonator tan $\delta_{measured}^R$ (where R is a label for each resonator), then models the fill fractions $F_{region}^R$ for each region for each geometry using Equation 2 one will end up with the following set of equations:

$$\tan \delta_{measured}^{R1} = F_{Si}^{R1} \tan \delta_{Si} + F_{MS}^{R1} \tan \delta_{MS} + F_{SA}^{R1} \tan \delta_{SA} + F_{MA}^{R1} \tan \delta_{MA}$$

$$\tan \delta_{measured}^{R2} = F_{Si}^{R2} \tan \delta_{Si} + F_{MS}^{R2} \tan \delta_{MS} + F_{SA}^{R2} \tan \delta_{SA} + F_{MA}^{R2} \tan \delta_{MA}$$

$$\tan \delta_{measured}^{R3} = F_{Si}^{R3} \tan \delta_{Si} + F_{MS}^{R3} \tan \delta_{MS} + F_{SA}^{R3} \tan \delta_{SA} + F_{MA}^{R3} \tan \delta_{MA}$$

$$\tan \delta_{measured}^{R4} = F_{Si}^{R4} \tan \delta_{Si} + F_{MS}^{R4} \tan \delta_{MS} + F_{SA}^{R4} \tan \delta_{SA} + F_{MA}^{R4} \tan \delta_{MA}$$

From measurements one knows all the tan $\delta_{measured}^R$ for each region of the four resonators, so one has four equations and four unknowns that will allow for the four loss tangents tan $\delta_{region}$ to be solved.

It is advantageous in processor design to ensure the CPW resonator geometries studied have diverse enough fill fractions in each region to ensure that the regions can be clearly separated.

Flux Noise Measurements

The present disclosure applies the fill fraction method outlined above for flux/paramagnetic defect noise measurements instead of charge/Two-Level System (TLS) noise measurements. The present systems and methods employ superconducting CPW resonators of several different geometries measured using on-chip electron spin resonance (cESR).

ESR at room temperature may be used to study paramagnetic defects in deposited dielectric films. In some implementations, such dielectric films may be deposited on high-resistivity crystalline Silicon (c-Si) substrates because, if native Silicon Oxide ($SiO_x$) is removed (e.g., etched off) from the substrate before measurement, such a substrate has very low paramagnetic defect density. In another implementation, sapphire (c-Al2O3) is used as a material for a substrate over which a dielectric is deposited. A material sample to be measured is loaded into a metal cavity of a standard ESR measurement apparatus and then placed in a large, slowly swept magnetic field $B_0$. The sample is placed such that driving the microwave cavity generates a field $B_1$ perpendicular to $B_0$, and when given a paramagnetic defect splitting (a Zeeman splitting due to $B_0$) comes into resonance with the cavity, its quality factor Q changes and can be detected.

The signal expected from an ESR measurement also includes a magnetic field fill fraction η. The ESR signal voltage for a Bruker-type machine is $V_s = \chi'' \eta Q \sqrt{PZ_0}$, where $\chi''$ is the magnetic susceptibility of the material under test, Q is the resonator quality factor, P is the microwave drive power, and $Z_0$ is the system impedance (e.g., typically 50Ω). The magnetic field fill fraction η for a given region is the magnetic field energy in that region ($U_{region}$) over the total magnetic field energy in the resonator ($U_{total}$):

$$\eta_{region} = \frac{U_{region}}{U_{total}} = \frac{\int_{V_{region}} \frac{1}{\mu_{region}} \vec{B}^2(\vec{r}) d\vec{r}}{\int_{V_{total}} \frac{1}{\mu_{effective}} \vec{B}^2(\vec{r}) d\vec{r}} \quad (4)$$

where B is the magnetic field, and μ is magnetic permeability and depends on the magnetic susceptibility χ:

$$\mu = \mu_0(1 + \chi_0) = \mu_0\left(1 + \chi''\frac{(\Delta\omega)}{\omega}\right) \quad (5)$$

where ω is the drive frequency.

The magnetic susceptibility χ can further be broken down into an expression that is based on the spin density $N_0$:

$$\chi'' = \frac{\gamma \hbar \mu_0}{4 k_B} \frac{N_0}{T} \frac{\omega}{\Delta\omega} = 7.84 \times 10^{-30} \frac{N_0}{T} \frac{\omega}{\Delta\omega} \quad (6)$$

where T is temperature, γ is the electron gyromagnetic ratio, $\mu_0$ is magnetic permeability of free space, h is the reduced Planck constant and $k_b$ is the Boltzmann constant. Plugging Equation 6 into Equation 5 gives an expression for μ in terms of spin density:

$$\mu = \mu_0\left[1 + 7.84 \times 10^{-30} \frac{N_0}{T}\right] = \mu_0\left[1 + \alpha \frac{N_0}{T}\right] \quad (7)$$

Where α is a constant. This implies having to know $N_0$ to calculate μ for fill fraction simulation. Assuming $N_0=1\times10^{15}$ cm$^{-3}=1\times10^{21}$ m$^{-3}$ and T=0.01 K in Equation 8:

$$\mu = \mu_0 \left[1 + 7.84 \times 10^{-30} \frac{1 \times 10^{21}}{0.01}\right] = \mu_0 [1 + 7.84 \times 10^{-7}] \sim \mu_0 \quad (8)$$

Since many dielectrics seem to have $N_0$ in the range $[1\times10^{15}, 1\times10^{19}]$cm$^{-3}$ in all regions, this suggest it is possible to ignore changes in μ due to parametric defects in the fill fraction calculation and use $\mu_0$ in all regions.

A simplified magnetic field fill fraction expression is shown in Equation 9:

$$\eta_{region} = \frac{U_{region}}{U_{total}} = \frac{\int_{V_{region}} \frac{1}{\mu_0} \vec{B}^2(\vec{r}) d\vec{r}}{\int_{V_{total}} \frac{1}{\mu_0} \vec{B}^2(\vec{r}) d\vec{r}} \quad (9)$$

The spin density N of each region in the tan δ measurements from the previous section could be described with the simple expression for a given CPW geometry:

$$N_{total} = \eta_{Si} N_{Si} + \eta_{MS} N_{MS} + \eta_{SA} N_{SA} + \eta_{MA} S_{MA} \quad (10)$$

Measuring ESR data (and subsequent magnetic fill fraction) from all resonators with different geometries produces a linear system of equations that can be solved, given there are enough geometry variations.

Further to what was demonstrated in Calusine et al. with solving for the loss tangent in four different regions of the CPW geometry, the present disclosure proposes to solve for spin density in different regions of CPW used for cESR. In an example implementation, four spatial regions are of interest, and measurements may be introduced into the system of linear equations shown in Equation 11:

$$N_{measured}^{R1} = \eta_{Si}^{R1} N_{Si} + \eta_{MS}^{R1} N_{MS} + \eta_{SA}^{R1} N_{SA} + \eta_{MA}^{R1} N_{MA}$$

$$N_{measured}^{R2} = \eta_{Si}^{R2} N_{Si} + \eta_{MS}^{R2} N_{MS} + \eta_{SA}^{R2} N_{SA} + \eta_{MA}^{R2} N_{MA}$$

$$N_{measured}^{R3} = \eta_{Si}^{R3} N_{Si} + \eta_{MS}^{R3} N_{MS} + \eta_{SA}^{R3} N_{SA} + \eta_{MA}^{R3} N_{MA}$$

$$N_{measured}^{R4} = \eta_{Si}^{R4} N_{Si} + \eta_{MS}^{R4} N_{MS} + \eta_{SA}^{R4} N_{SA} + \eta_{MA}^{R4} N_{MA} \quad (11)$$

In this example embodiment there will be four measurements $N_{measured}^R$ (where R is a label for each resonator) and the $B_1$ field fill fraction will be calculated for each region of each unique resonator $\eta_{region}^R$, which allows the four equations to be solved for the four unknown spin densities $N_{region}^R$.

Note that the fill fraction affects the signal to noise ratio (SNR) for each region according to Equation 12:

$$SNR = \frac{V_S}{V_N} = \frac{\chi'' \eta Q \sqrt{PZ_0}}{\sqrt{P_n Z_0}} = \chi'' \eta Q \sqrt{\frac{P}{P_n}} \quad (12)$$

where Q is the resonator quality factor, P is the drive power and P n is the noise power at the resonator output, $V_S$ and $V_N$ are the signal voltage and noise voltage at the resonator output, $Z_0$ is charact impedance of transmission line to which the resonator is coupled.

Figure 3:
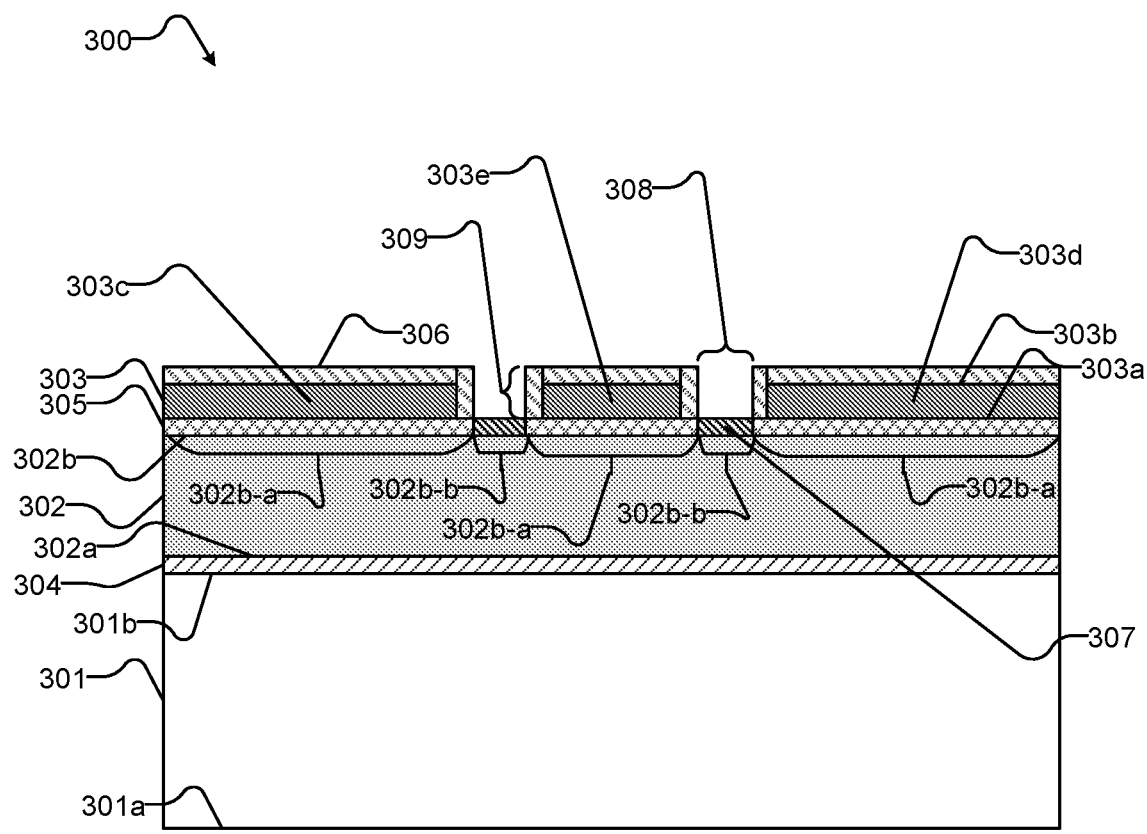
FIG. 3 is a schematic diagram of a cross section of a superconducting fabrication stack that includes resonators to measure noise in discrete regions of the fabrication stack.
Figure 4:
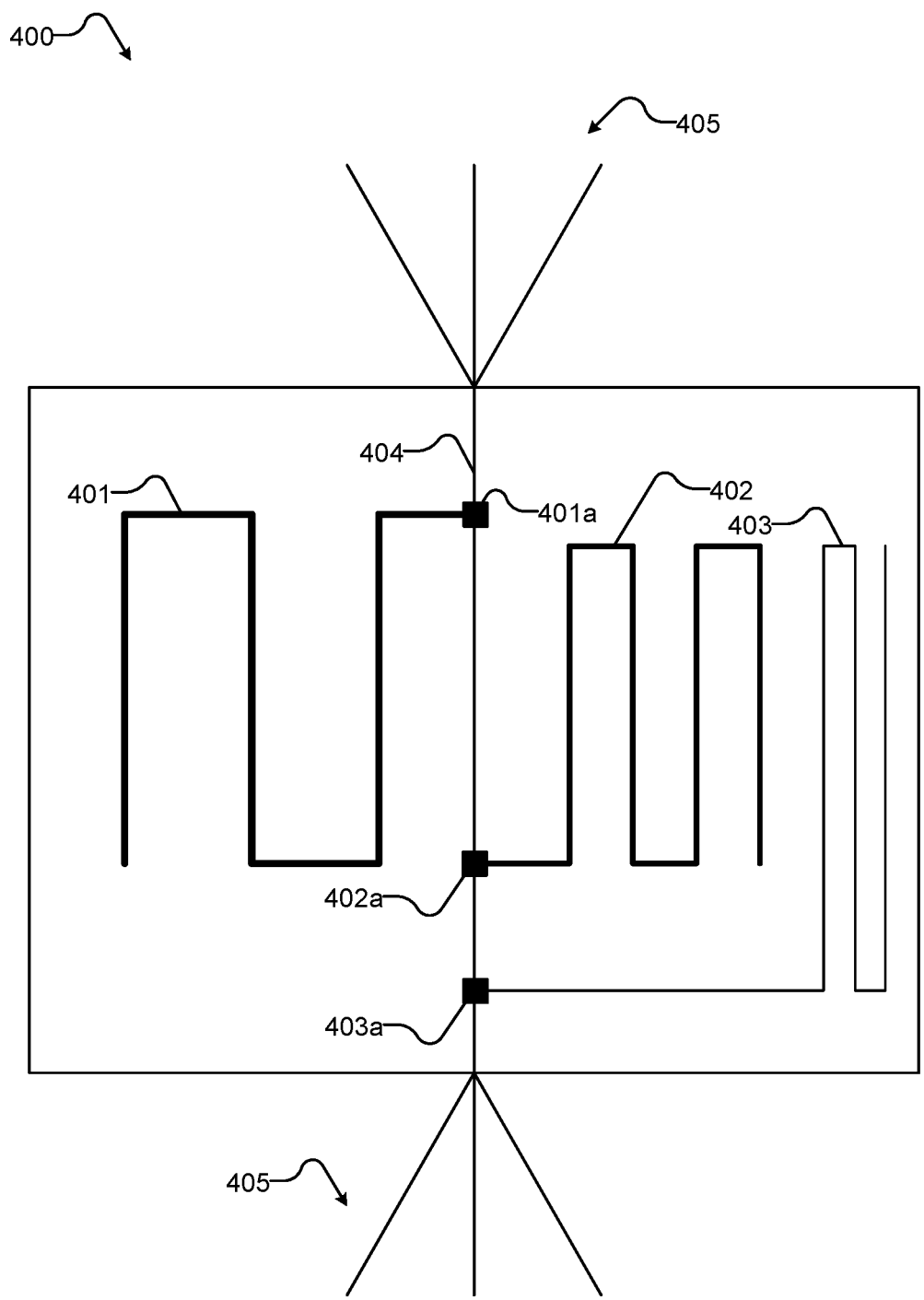
FIG. 4 is a plan view of a superconducting fabrication stack that includes a plurality of resonators, each resonator having a different geometry.

In one implementation, the superconducting material implemented in the present systems may be niobium (Nb). In another implementation, the superconducting material implemented in the present system may include one of: aluminum (Al), tantalum (Ta), niobium nitride (NbN), titanium nitride (TiN), or niobium titanium nitride (NbTiN). As shown in FIGS. 3 and 4, the superconducting material overlays a dielectric in a fabrication stack.

Figure 2:
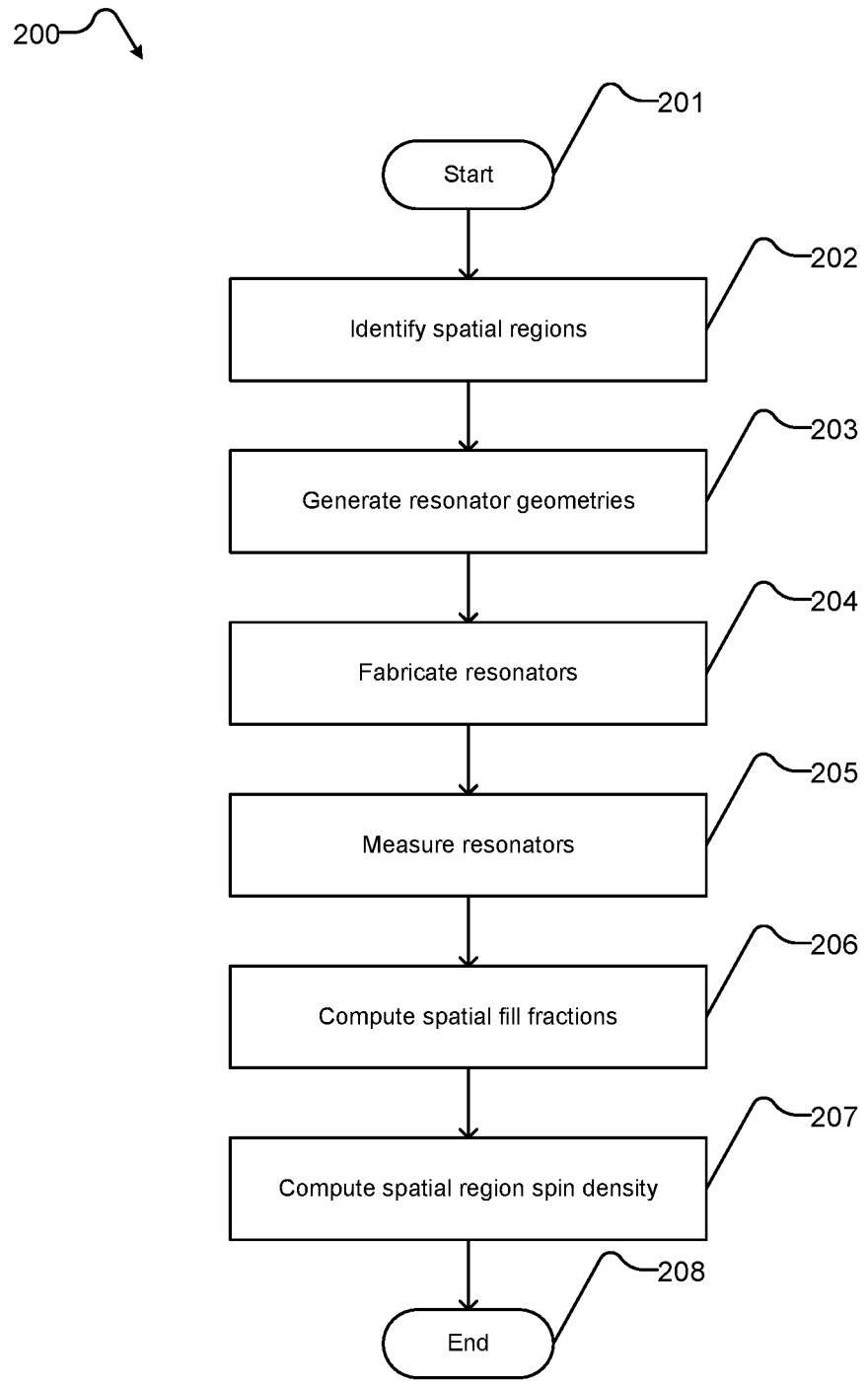
FIG. 2 is a flowchart that illustrates an example method of measuring noise in discrete regions of a multi-layer superconducting integrated circuit, in accordance with the present systems and methods.

FIG. 2 is a flowchart that illustrates an example method 200 of measuring noise in discrete regions of a multi-layer superconducting fabrication stack, for example the multi-layer fabrication stack of FIG. 3 or 4, in accordance with the present systems and methods. In some implementations, the multi-layer superconducting fabrication stack may be a planned multi-layer superconducting processor chip. The processor chip may be used, for example, for quantum computing.

Method 200 comprises acts 201 to 208; however, a person skilled in the art will understand that the number of acts is an example, and, in some implementations, certain acts may be omitted, further acts may be added, and/or the order of the acts may be changed. Method 200 may be executed by a digital computer, for example digital computer 102 in hybrid computing system 101.

Method 200 starts at 201, for example in response to a call from another routine.

At 202, at least one spatial region of a proposed multi-layer superconducting fabrication stack or integrated circuit is identified. In some implementations, the multi-layer superconducting fabrication stack may be a proposed multi-layer superconducting processor chip that can be used, for example, for quantum computing. It will be understood that the proposed multi-layer superconducting integrated circuit may not have been fabricated, and may instead be a planned layout. For example, spatial regions based on proximity to one or more qubit wiring layers in the multi-layer processor chip may be identified as being of particular interest because of the proximity to noise-sensitive devices. For example, a proposed superconducting processor chip may have a substrate, a dielectric layer proposed to overly the substrate, and a first superconducting metal wiring layer that is proposed to contain all or part of qubit wiring for a processor overlying the dielectric layer. It may be beneficial to determine noise characteristics for some or all of the substrate, the dielectric to substrate interface, the metal to dielectric interface, the metal surface, and the metal to air (or metal to vacuum) interface.

At 203, a plurality of different resonator geometries is generated. In one implementation, the resonators may be CPW resonators. At least one resonator geometry per spatial region identified at 202 is generated, so that the number of equations in the system of Equations 11 matches the number of variables. For example, if five spatial regions are identified at 202, at least five different resonator geometries are generated at 203. As discussed above, varying resonator geometry can, in some implementations, allow for tuning of each resonator frequency. By providing resonators having sufficiently distinct geometries, the signals generated by each resonator can be detected and measured separately.

In an example implementation, the geometries of CPW resonators may be varied by altering the cross section (e.g., the width between the ground plates and the center conductor of a resonator, or the width of the center conductor). Another example of a resonator geometry change is etching trenches of different depths between the center conductor and the ground plates. Yet another example of geometry variation is altering the length of the resonator.

At 204, a plurality of resonators is fabricated in and/or on a multi-layer superconducting fabrication stack. In one implementation, the resonators may be CPW resonators. In one example implementation, a multi-layer superconducting integrated circuit that reflects the proposed multi-layer superconducting fabrication stack of act 202 is fabricated. Based on the example given above and further described in FIGS. 3 and 4, a resonator may be fabricated on a layer overlaying the dielectric layer in the superconducting fabrication stack. Each resonator is fabricated according to a distinct (i.e., different) one of the plurality of resonator geometries generated at 203 and has a unique resonance frequency. The resonance frequency can be chosen after determining the cross-section geometry of the resonator by varying the length of the resonator. The unique resonance frequency is used to uniquely address each resonator. Optionally, digital computer 102 measures the resonator geometries dimensions via scanning electron microscope (SEM).

At 205, on-chip electron spin resonance (cESR) spectra from each resonator fabricated at 204 is measured.

At 206, digital computer 102 computes magnetic field fill fractions η of each spatial region using electro-magnetic (EM) field modeling together with the respective dimensions of each the resonator geometry from act 204. The magnetic field fill fraction η for a given region is the magnetic field energy in that region over the total magnetic field energy in the resonator. In one implementation, digital computer 102 uses a simplified fill fraction expression, in accordance with Equation 9 above.

At 207, digital computer 102 computes each spatial region's spin density using the magnetic field fill fractions η computed at 206 and the cESR spectra measured at 205, as described above with reference to system of Equations 11.

At 208, method 200 ends, until it is for example, invoked again.

FIG. 3 is a schematic diagram of a cross section of an example superconducting fabrication stack 300 that includes resonators to measure noise in discrete regions of the stack.

Superconducting fabrication stack 300 comprises a substrate 301, having a first surface 301a and a second surface 301b, opposite the first surface, a dielectric layer 302, having a first surface 302a and a second surface 302b, opposite the second surface, and a metal layer 303, having a first surface 303a and a second surface 303b, opposite the first surface.

Superconducting fabrication stack 300 further comprises a first interface 304, a substrate-to-dielectric interface, that in contact with substrate 301 and with dielectric layer 302, so that first interface 304 is in contact with second surface 301b of substrate 301 and with first surface 302a of dielectric layer 302. Superconducting fabrication stack 300 also comprises a second interface 305, a dielectric-to-metal interface, that is in contact with a portion of dielectric layer 302 and with metal layer 303, so that second interface 305 is in contact with a portion 302b-a of second surface 302b of dielectric layer 302 and with first surface 303a of metal layer 303. A third interface 306, a metal-to-air (or metal-to-vacuum) interface, is in contact with metal layer 303 so that third interface 306 is in contact with second surface 303b of metal layer 303. A fourth interface 307, a dielectric-to-m air or (dielectric-to-vacuum) interface, is in contact a portion of dielectric layer 302 so that fourth interface 307 is in contact with a portion 302b-b of second surface 302b of dielectric layer 302.

Metal layer 303 comprises resonators for measuring noise in superconducting fabrication stack 300, as discussed in method 200 of FIG. 2. Metal layer 303 comprises a first ground plate 303c, a second ground plate 303d and a center conductor 303e to form a resonator. Only one resonator in metal layer 303 is shown in superconducting metal stack 300 to reduce visual clutter, but a person skilled in the art will understand that superconducting fabrications stack 300 may comprise a higher number of resonators in metal layer 303. In particular, superconducting fabrication stack 300 may comprise four resonators to measure noise in the four interfaces 304 through 307. In an example implementation, four resonators are etched into metal layer 303. An example of a geometry change, as discussed above is the width 308 between ground plates 303c, 303d and a center conductor 303e of a resonator, or the depth 309 of the trench between ground plates 303c, 330d and center conductor 303e.

According to the embodiment of superconducting fabrication stack 300 of FIG. 3, spatial regions that may be measured are first, second, third and fourth interfaces 304, 305, 306 and 307.

FIG. 4 is a plan view of an example superconducting fabrication stack 400 that includes three resonators, each resonator having a different geometry.

Superconducting fabrication stack 400 comprises a first resonator 401, a second resonator 402 and a third resonator 403. Resonators 401 is coupled to a transmission line 404 via coupling device 401a, resonator 402 is coupled to transmission line 404 via coupling device 402a and resonator 403 is coupled to transmission line 404 via coupling device 403a. Coupling devices 401a, 402a and 403a are capacitive coupling device. In an alternative implementation, coupling devices 401a, 402a and 403a are inductive coupling devices. A person skilled in the art will understand that only three resonators are shown in FIG. 4 but superconducting fabrication stack 400 may comprise a lower or higher number of resonators, in particular superconducting fabrication stack 400 may comprise as many resonators are spatial regions to be measured. In an example implementation, resonators 401, 402 and 403 are etched on a superconducting metal layer of superconducting fabrication stack 400, e.g., metal layer 303 of superconducting fabrication stack 300. Superconducting fabrication stack 400 also comprises wirebonding 405 coupled to transmission line 404. Transmission line 404 is used to drive frequencies to resonators 401, 402 and 403, and to readout measurements from resonators 401, 402 and 403. Each resonator 401, 402 and 403 has a different geometry, for example different width between ground plates and center conductor, represented in FIG. 4 by lines of different thickness, and different length, thereby resulting in a different resonator frequency. In an example embodiment, resonator 401 may have resonant frequency of 9.5 GHz, resonator 402 of 9.75 GHz, and resonator 403 of 10.0 GHz.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for example purposes only and may change in alternative examples. Some of the example acts or operations of the above described method(s), process (es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the example methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to:

U.S. Pat. Nos. 7,533,068, 7,876,248; 8,035,540; 8,098, 179; 8,536,566; 11,295,225; US Patent Application No. Publication 2018/02219150A1; and U.S. Provisional Patent Application No. 63/276,113.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method of conducting spatial noise measurements in a superconducting fabrication stack, the superconducting fabrication stack comprising one or more material interfaces, the method comprising:
   identifying one or more spatial regions of the superconducting fabrication stack;
   generating a plurality of resonator geometries;
   fabricating a plurality of resonators on the superconducting fabrication stack, each resonator of the plurality of resonators having a respective one of the plurality of resonator geometries;
   measuring data from the plurality of resonators;
   calculating fill fractions for the one or more spatial regions of the superconducting fabrication stack based on electromagnetic (EM) field modeling and respective dimensions of each resonator geometry; and
   determining a spin density for each spatial region of the one or more spatial regions of the superconducting fabrication stack based on the data measured from the plurality of resonators and the calculated fill fractions.

2. The method of claim 1, wherein measuring data from the plurality of resonators comprises measuring spectra of each resonator in the plurality of resonators using on-chip electron-spin resonance (cESR); and determining a spin density for each spatial region of the one or more spatial regions of the superconducting fabrication stack based on the data measured from the plurality of resonators and the calculated fill fractions comprises determining a spin density for each spatial region of the one or more spatial regions of the superconducting fabrication stack based on the cESR spectra measured from the plurality of resonators and the calculated fill fractions.

3. The method of claim 1, wherein fabricating a plurality of resonators comprises fabricating a plurality of coplanar waveguide resonators.

4. The method of claim 1, wherein fabricating a plurality of resonators on the superconducting fabrication stack, each resonator of the plurality of resonators having a respective one of the plurality of resonator geometries comprises fabricating a plurality of resonators on the superconducting fabrication stack, each resonator of the plurality of resonators having a respective resonance frequency.

5. The method of claim 1, further comprising measuring the resonator geometries via scanning electron microscope (SEM) after fabricating the plurality of resonators.

6. The method of claim 1, wherein generating a plurality of resonator geometries comprises generating as many resonator geometries as identified spatial regions.

7. The method of claim 1, wherein identifying one or more spatial regions of the superconducting fabrication stack comprises identifying one or more spatial regions of the superconducting fabrication stack, the one or more spatial regions comprising at least one of: niobium, aluminum, tantalum, niobium nitride, titanium nitride, or niobium titanium nitride.

8. The method of claim 1, wherein identifying one or more spatial regions of the superconducting fabrication stack comprises identifying one or more spatial regions of the superconducting fabrication stack, the one or more spatial regions comprising at least the one or more material interfaces.

9. The method of claim 1, wherein fabricating a plurality of resonators on the superconducting fabrication stack comprises fabricating a plurality of resonators on a metal layer overlying a dielectric layer in the superconducting fabrication stack.

10. The method of claim 9 wherein fabricating a plurality of resonators on a metal layer overlying a dielectric layer in the superconducting fabrication stack comprises etching a plurality of resonators on a metal layer overlying a dielectric layer in the superconducting fabrication stack.

11. A method of conducting spatial noise measurements in a superconducting fabrication stack, the superconducting fabrication stack comprising a plurality of resonators, each resonator having a different resonator geometry, and the superconducting fabrication stack comprising a plurality of spatial regions, the method executed by a digital processor and comprising:
   measuring data from the plurality of resonators;
   calculating fill fractions for each spatial region in the plurality of spatial regions of the superconducting fabrication stack based on electromagnetic (EM) field modeling and respective dimensions of each resonator geometry; and
   determining a spin density for each spatial region in the plurality of spatial regions of the superconducting fabrication stack based on the data measured from the plurality of resonators and the calculated fill fractions.

12. The method of claim 11, wherein measuring data from the plurality of Resonators comprises measuring spectra of each resonator in the plurality of resonators using on-chip electron-spin resonance (cESR); and determining a spin density for each spatial region in the plurality of spatial regions of the superconducting fabrication stack based on the data measured from the plurality of resonators and the calculated fill fractions comprises determining a spin density for each spatial region in the plurality of spatial regions of the superconducting fabrication stack based on the cESR spectra measured from the plurality of resonators and the calculated fill fractions.

13. The method of claim 12, wherein measuring spectra of each resonator in the plurality of resonators using on-chip electron-spin resonance (cESR) comprises measuring cESR spectra of each resonator in the plurality of resonators, wherein each resonator has a unique resonance frequency.

14. The method of claim 11, wherein measuring data from the plurality of resonators comprises measuring data from a plurality of coplanar waveguide resonators.

15. The method of claim 11 wherein measuring data from the plurality of resonators comprises measuring data from the plurality of resonators, wherein there are as many resonators as spatial regions.

16. The method of claim 11, wherein calculating fill fractions for each spatial region of the plurality of spatial regions of the superconducting fabrication stack comprises calculating fill fractions for each spatial region of the plurality of spatial regions of a superconducting fabrication stack, at least one spatial region of the plurality of spatial regions comprising at least one of: niobium, aluminum, tantalum, niobium nitride, titanium nitride, or niobium titanium nitride.

17. The method of claim 11, wherein collecting data from the plurality of resonators comprises collecting data from the plurality of resonators fabricated on a metal layer overlaying a dielectric layer in the superconducting fabrication stack.

18. The method of claim 11, wherein calculating fill fractions for each spatial region in the plurality of spatial regions comprises calculating fill fractions for each spatial region in the plurality of spatial regions, at least one spatial region of the plurality of spatial regions comprising a material interface.

* * * * *